(12) United States Patent
Lee et al.

(10) Patent No.: US 11,527,635 B2
(45) Date of Patent: Dec. 13, 2022

(54) FERROELECTRIC THIN-FILM STRUCTURES, METHODS OF MANUFACTURING THE SAME, AND ELECTRONIC DEVICES INCLUDING THE FERROELECTRIC THIN-FILM STRUCTURES

(71) Applicant: Samsung Electronics Co., Ltd., Suwon-si (KR)

(72) Inventors: Yunseong Lee, Osan-si (KR); Sangwook Kim, Seongnam-si (KR); Sanghyun Jo, Seoul (KR); Jinseong Heo, Seoul (KR); Hyangsook Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 45 days.

(21) Appl. No.: 16/890,231

(22) Filed: Jun. 2, 2020

(65) Prior Publication Data
US 2021/0098595 A1    Apr. 1, 2021

(30) Foreign Application Priority Data
Sep. 26, 2019   (KR) .......................... 10-2019-0119088

(51) Int. Cl.
*H01L 29/51* (2006.01)
*H01L 29/78* (2006.01)
*H01L 21/02* (2006.01)

(52) U.S. Cl.
CPC ........ *H01L 29/516* (2013.01); *H01L 21/0228* (2013.01); *H01L 29/78391* (2014.09)

(58) Field of Classification Search
None
See application file for complete search history.

(56) References Cited

U.S. PATENT DOCUMENTS

| 2009/0061538 | A1  | 3/2009 | Heo et al. |
| 2010/0119727 | A1* | 5/2010 | Takagi ............... C23C 16/45521 427/532 |
| 2015/0214322 | A1  | 7/2015 | Mueller et al. |
| 2015/0255267 | A1* | 9/2015 | Tapily ............... H01L 21/28194 438/763 |
| 2018/0240803 | A1* | 8/2018 | Yoo .................... H01L 21/02181 |
| 2018/0240804 | A1* | 8/2018 | Yoo .................... H01L 21/02356 |
| 2019/0019683 | A1  | 1/2019 | Yoo |
| 2020/0006547 | A1* | 1/2020 | Hsu ........................ H01L 29/516 |

(Continued)

OTHER PUBLICATIONS

Park, Tae Joo et al., "Improved Growth and Electrical Properties of Atomic-Layer-Deposited Metal-Oxide Film by Discrete Feeding Method of Metal Precursor" Chemistry of Materials, dx.doi.org/10.1021/cm100900k, vol. 23, pp. 1654-1658 (2011).

(Continued)

*Primary Examiner* — Xiaoming Liu
(74) *Attorney, Agent, or Firm* — Harness, Dickey & Pierce, P.L.C.

(57) ABSTRACT

A ferroelectric thin-film structure includes at least one first atomic layer and at least one second atomic layer. The first atomic layer includes a first dielectric material that is based on an oxide, and the second atomic layer includes both the first dielectric material and a dopant that has a bandgap greater than a bandgap of the dielectric material.

19 Claims, 13 Drawing Sheets

(56) References Cited

U.S. PATENT DOCUMENTS

2020/0176610 A1    6/2020   Lee et al.

OTHER PUBLICATIONS

Ahn, Ji-Hoon et al., "Enhanced electrical properties of Hf-aluminate thin films by crystal structure modulation", Materials Letters, vol. 157, https://dx.doi.org/10.1016/j.matlet.2015.05.045, pp. 215-218 (2015).
Long, Rathnait D. et al., "Surface Preparation and Deposited Gate Oxides for Gallium Nitride Based Metal Oxide Semiconductor Devices", Materials, vol. 5, pp. 1297-1335, doi:10.3390/ma5071297 (2012).
Extended European Search Report dated Jan. 12, 2021 for corresponding European Application No. 20184502.1.
Elena O., Filatova et al., "Interpretation of the Changing the Band Gap of $Al_2O_3$ Depending on Its Crystalline Form: Connection with Different Local Symmetries", The Journal of Physical Chemistry C, vol. 119, No. 35, Aug. 21, 2015, pp. 20755-20761, XP055760908.

\* cited by examiner

FERROELECTRIC THIN-FILM STRUCTURES, METHODS OF MANUFACTURING THE SAME, AND ELECTRONIC DEVICES INCLUDING THE FERROELECTRIC THIN-FILM STRUCTURES

CROSS-REFERENCE TO RELATED APPLICATION

This application claims the benefit of Korean Patent Application No. 10-2019-0119088, filed on Sep. 26, 2019, in the Korean Intellectual Property Office, the disclosure of which is incorporated herein in its entirety by reference.

BACKGROUND

1. Field

The present disclosure relates to ferroelectric thin-film structures, methods and/or systems for manufacturing the ferroelectric thin-film structures, electronic devices including the ferroelectric thin-film structures, and systems and/or methods for manufacturing the electronic devices.

2. Description of the Related Art

Silicon-based electronic devices of the related art have limitations in improving the operating characteristics and scaling down. For example, when operating voltage and current characteristics of conventional silicon-based logic transistors are measured, the sub-threshold swing (SS) is limited to about 60 mV/dec. As the size of logic transistors decreases, it is difficult to lower the operating voltage to about 0.8 V or less, and accordingly, the power density is increased, which leads to a limitation in the scale-down of logic transistors. In order to solve this issue, electronic devices using ferroelectric thin-film structures have been developed.

SUMMARY

Provided are ferroelectric thin-film structures, methods and/or systems for manufacturing the ferroelectric thin-film structures, electronic devices including the ferroelectric thin-film structures, and methods and/or systems for manufacturing the electronic devices.

Additional aspects will be set forth in part in the description which follows and, in part, will be apparent from the description, or may be learned by practice of the presented embodiments of the disclosure.

According to some example embodiments, a ferroelectric thin-film structure may include at least one first atomic layer including a first dielectric material that is based on an oxide, and at least one second atomic layer including both the first dielectric material and a dopant. The dopant may have a bandgap greater than a bandgap of the first dielectric material.

The first dielectric material may include an oxide of at least one of hafnium (Hf), zirconium (Zr), or aluminum (Al), or a perovskite of at least one of hafnium (Hf), zirconium (Zr), or aluminum (Al).

The dopant may include an oxide of at least one of silicon (Si), hafnium (Hf), zirconium (Zr), aluminum (Al), lanthanum (La), yttrium (Y), strontium (Sr), or gadolinium (Gd).

The ferroelectric thin-film structure may further include a plurality of atomic layers, each atomic layer of the plurality of atomic layers including an identical dielectric material, the plurality of atomic layers including the at least one first atomic layer.

The ferroelectric thin-film structure may further include a plurality of atomic layers including different dielectric materials, the plurality of atomic layers including the at least one first atomic layer.

The at least one second atomic layer may include at least one of an uppermost portion of the ferroelectric thin-film structure, a middle portion of the ferroelectric thin-film structure, or a lowermost portion of the ferroelectric thin-film structure.

The ferroelectric thin-film structure may have a thickness of about 0.1 nm to about 2 nm.

According to some example embodiments, a method of forming a ferroelectric thin-film structure by atomic layer deposition (ALD) may include depositing, on a substrate, a first atomic layer according to a first atomic layer deposition (ALD) operation, the first atomic layer including a first dielectric material that is based on an oxide; and depositing a second atomic layer on the first atomic layer according to a second atomic layer (ALD) operation, the second atomic layer including both the first dielectric material and a dopant, the dopant having a bandgap greater than a bandgap of the first dielectric material.

The depositing of the first atomic layer according to the first atomic layer deposition (ALD) operation may include forming a precursor of the first dielectric material on the substrate, and supplying an oxidant to the precursor of the first dielectric material to cause the oxidant to react with the precursor of the first dielectric material to form the first atomic layer.

The depositing of the second atomic layer may include forming a separate precursor of the first dielectric material on a portion of the first atomic layer, such that a separate portion of the first atomic layer is exposed by the separate precursor of the first dielectric material, forming a precursor of the dopant on the separate portion of the first atomic layer which is exposed by the precursor of the dielectric material, and reacting the precursor of the dielectric material and the precursor of the dopant with an oxidant to form the second atomic layer.

The first dielectric material may include an oxide of at least one of hafnium (Hf), zirconium (Zr), or aluminum (Al), or a perovskite of at least one of hafnium (Hf), zirconium (Zr), or aluminum (Al).

The dopant may include an oxide of at least one of silicon (Si), hafnium (Hf), zirconium (Zr), aluminum (Al), lanthanum (La), yttrium (Y), strontium (Sr), or gadolinium (Gd).

According to some example embodiments, an electronic device may include a substrate, a gate electrode on the substrate, and a ferroelectric layer between the substrate and the gate electrode. The ferroelectric layer may include at least one first atomic layer including a first dielectric material that is based on an oxide; and at least one second atomic layer including both the dielectric material and a dopant, the dopant having a bandgap greater than a bandgap of the first dielectric material.

The first dielectric material may include an oxide of at least one of hafnium (Hf), zirconium (Zr), or aluminum (Al), or a perovskite of at least one of hafnium (Hf), zirconium (Zr), or aluminum (Al).

The dopant may include an oxide of at least one of silicon (Si), hafnium (Hf), zirconium (Zr), aluminum (Al), lanthanum (La), yttrium (Y), strontium (Sr), or gadolinium (Gd).

The ferroelectric layer may include a plurality of atomic layers, each atomic layer of the plurality of atomic layers including an identical dielectric material, the plurality of atomic layers including the at least one first atomic layer.

The ferroelectric layer may include a plurality of atomic layers including different dielectric materials, the plurality of atomic layers including the at least one first atomic layer.

The substrate may include a channel element vertically overlapping with the gate electrode, and a source and a drain at opposite sides of the channel element.

The channel element may include at least one of Si, Ge, SiGe, III-V semiconductors, oxide semiconductors, nitride semiconductors, oxynitride semiconductors, 2-dimensional (2D) materials, quantum dots, or organic semiconductors.

According to some example embodiments, an electronic device may include a first electrode and a second electrode spaced apart from each other; and a ferroelectric layer between the first electrode and the second electrode. The ferroelectric layer may include at least one first atomic layer including a first dielectric material that is based on an oxide; and at least one second atomic layer including both the first dielectric material and a dopant, the dopant having a bandgap that is greater than a bandgap of the first dielectric material.

According to some example embodiments, a method of manufacturing an electronic device may include forming a ferroelectric thin-film structure, and fabricating the electronic device based on incorporating the ferroelectric thin-film structure into an electronic device component.

The electronic device component may include at least one of a processing circuitry or a memory.

According to some example embodiments, a system for forming a ferroelectric thin-film structure may include a process chamber including a pedestal or chuck configured to structurally support a substrate in the process chamber; a plurality of composition sources and a plurality of control devices, each composition source coupled to the process chamber via a separate control device, each control device configured to control a supply of a separate material held in a separate coupled composition source to the process chamber; and an electronic device configured to control at least the plurality of control devices to deposit, on the substrate in the process chamber, a first atomic layer according to a first atomic layer deposition (ALD) operation, the first atomic layer including a first dielectric material that is based on an oxide, and deposit a second atomic layer on the first atomic layer according to a second atomic layer (ALD) operation, the second atomic layer including both the first dielectric material and a dopant, the dopant having a bandgap greater than a bandgap of the first dielectric material.

The system may further include a heat source configured to heat at least a portion of the process chamber. The electronic device may be configured to control the heat source to perform a heat treatment process on the first and second atomic layers to crystallize the first and second atomic layers.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
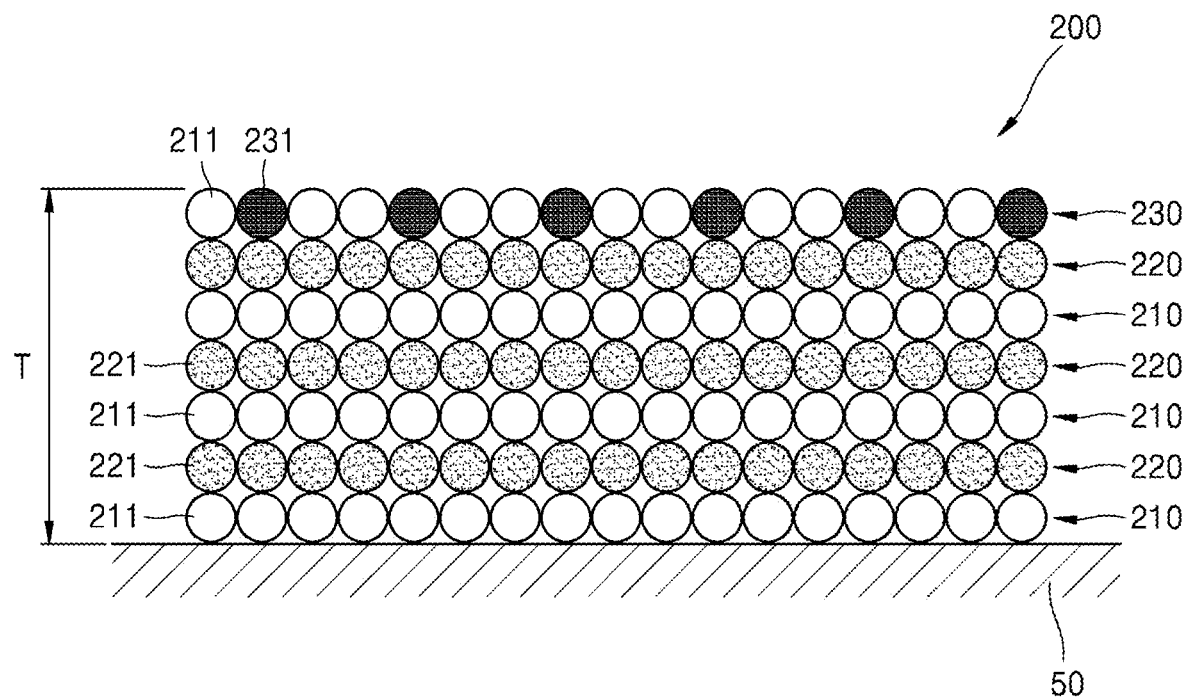
FIG. 1 illustrates a cross-section of a ferroelectric thin-film structure according to some example embodiments.

Reference will now be made in detail to example embodiments, examples of which are illustrated in the accompanying drawings, wherein like reference numerals refer to like elements throughout. In this regard, some example embodiments may have different forms and should not be construed as being limited to the descriptions set forth herein. Accordingly, some example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, some example embodiments will be described in detail with reference to the accompanying drawings. In the drawings, like reference numerals refer to like elements, and the size of each element in the drawings may be exaggerated for clarity and convenience of description. Meanwhile, some example embodiments described below are merely examples, and these examples can be changed in various other forms.

Hereinafter, what is described as "on" or "above" may include in a contact or non-contact overlying relationship. Singular expressions include plural expressions unless the context clearly indicates otherwise. In addition, when an element is said to "include" a certain component, this means that it may further include other components, not excluding other components, unless otherwise stated.

The use of the term "the" and similar terminology may be used in the singular and the plural. In regard to the steps constituting a method, unless there are explicit descriptions on orders or otherwise, the steps may be performed in a suitable order. It is not necessarily limited to the order described in connection with the steps. The use of all examples or example terms is merely for the purpose of describing technical concepts in detail, and the examples or example terms would not limit the range unless they are limited by the claimed range.

FIG. 1 illustrates a cross-section of a ferroelectric thin-film structure according to some example embodiments. FIG. 1 shows a ferroelectric thin-film structure 200 manufactured by an atomic layer deposition (ALD) process.

Referring to FIG. 1, the ferroelectric thin-film structure 200 includes a plurality of atomic layers stacked on a substrate 50. In this regard, each of the atomic layers is formed per cycle in the atomic layer deposition (ALD) process, and may have a thickness at an atomic level. In some example embodiments, the ferroelectric thin-film structure 200 may have a very thin thickness, for example, a thickness T of about 0.1 nm to about 2 nm. However, embodiments of the present disclosure are not limited thereto.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%

The ferroelectric thin-film structure 200 shown in FIG. 1 includes at least one first atomic layer 210, at least one second atomic layer 220, and a third atomic layer 230. The at least one first atomic layer 210 and the at least one second atomic layer 220 may be alternately stacked on the substrate 50. In some example embodiments, at least one of the second atomic layer 220, the third atomic layer 230, or the substrate 50 may be omitted. In some example embodiments, the ferroelectric thin-film structure 200 includes a single first atomic layer 210 and a single third atomic layer 230 and does not include any additional layers.

In the example embodiments illustrated in FIG. 1, three first atomic layers 210 and three second atomic layers 220 are alternately stacked on the substrate 50. However, the present disclosure is not limited thereto, and the number of first atomic layers 210 and the second atomic layers 220 may be variously modified.

The first atomic layer 210 may include a first dielectric material 211 that is based on an oxide. The first dielectric material 211 may include, for example, a high-k material. The first dielectric material 211 may include, for example, an oxide of at least one of hafnium (Hf), zirconium (Zr), or aluminum (Al), or a perovskite (e.g., perovskite structure) of at least one of hafnium (Hf), zirconium (Zr), or aluminum (Al). However, embodiments of the present disclosure are not limited thereto.

For example, when the first dielectric material 211 is HfO, the first atomic layer 210 may be provided on (e.g., directly on) the substrate 50 by forming a Hf precursor on (e.g., directly on) the surface of the substrate 50 and then reacting the Hf precursor with an oxidant to form HfO on (e.g., directly on) the surface of the substrate 50 to thus form the first dielectric material 211 and thus form the first atomic layer 210.

The second atomic layer 220 may include a second dielectric material 221 based on an oxide that is different from the oxide on which the first atomic layer 210 is based. Accordingly, the first and second atomic layers 210 and 220 may be included in a plurality of atomic layers that include different dielectric materials. The second dielectric material 221 may include, for example, a high-k material. The second dielectric material 221 may include, for example, an oxide of at least one of hafnium (Hf), zirconium (Zr), or aluminum (Al), or a perovskite (e.g., perovskite structure) of at least one of hafnium (Hf), zirconium (Zr), or aluminum (Al). However, embodiments of the present disclosure are not limited thereto.

For example, when the second dielectric material 221 is ZrO, the second atomic layer 220 may be formed on the first atomic layer 210 by depositing a Zr precursor on (e.g., directly on) a top surface of the first atomic layer 210 and then reacting the Zr precursor with an oxidant to form ZrO on the top surface of the first atomic layer 210.

The first atomic layer 210 and the second atomic layer 220 may be arranged to alternately stack on the substrate 50, for example as shown in FIG. 1. The third atomic layer 230 may be provided on (e.g., directly on) a top surface of the uppermost layer of the second atomic layers 220. The third atomic layer 230 may include both the first dielectric material 211 and a dopant 231 having a bandgap greater than the bandgap of the first dielectric material 211. In some example embodiments, where the second atomic layers 220 are omitted from the ferroelectric thin-film structure 200, the third atomic layer 230 may be provided on (e.g., directly on) a top surface of a first atomic layer 210.

In the third atomic layer 230, the first dielectric material 211 is provided to partially cover the top surface of the second atomic layer 220, and a dopant 231 is provided to cover the top surface of the second atomic layer 220 exposed by the first dielectric material 211. In this regard, the content ratio of the first dielectric material 211 and the dopant 231 constituting the third atomic layer 230 may vary.

As described above, the first dielectric material 211 included in the third atomic layer 230 may include, for example, an oxide of at least one of Hf, Zr, or Al, or a perovskite of at least one of Hf, Zr, or Al. In addition, the dopant 231 included in the third atomic layer 230 may improve ferroelectric characteristics and electrical characteristics. The dopant 231 may include, for example, an oxide of at least one of silicon (Si), hafnium (Hf), zirconium (Zr), aluminum (Al), lanthanum (La), yttrium (Y), strontium (Sr), or gadolinium (Gd). However, embodiments of the present disclosure are not limited thereto.

In some example embodiments, the first atomic layer 210 and the second atomic layer 220 may include the first dielectric material 211 including HfO and the second dielectric material 221 including ZrO, respectively, and the third atomic layer 230 includes the first dielectric material 211 including HfO and the dopant 231 including AlO. In this case, the third atomic layer 230 may be formed by depositing a Hf precursor and an Al precursor on the top surface of the second atomic layer 220 and then reacting the Hf precursor and the Al precursor with an oxidant to form HfO and AlO on the top surface of the second atomic layer 220. Thereafter, the first atomic layer 210, the second atomic layer 220, and the third atomic layer 230 are crystallized by a heat treatment, thereby completing the manufacture of the ferroelectric thin-film structure 200. In this regard, the dopant 231 including AlO may improve electrical characteristics (e.g., leakage current characteristic or electric capacitance characteristics) of the ferroelectric thin-film structure 200 while maintaining ferroelectric characteristics thereof.

Ferroelectrics have spontaneous electric dipoles, that is, spontaneous polarization caused by non-centrosymmetric charge distribution in the unit cell in the crystallized material structure. Ferroelectrics have residual polarization due to dipoles even in the absence of an external electric field. In addition, the direction of polarization may be switched in the unit of a domain by an external electric field. Ferroelectrics may or may not have hysteresis characteristics depending on the external electric field.

In the ferroelectric thin-film structure 200 according to some example embodiments, the third atomic layer 230 including the first dielectric material 211 and the dopant 231 that has a greater bandgap than that of the first dielectric material 211, is provided on the first atomic layer 210 including the first dielectric material 211 and the second atomic layer 220 including the second dielectric material 221, wherein each of the first dielectric material 211 and the second dielectric material 221 are based on an oxide, and the dopant 231 included in the third atomic layer 230 may improve ferroelectric and electrical properties.

In a dielectric thin film of the related art, the smaller the thickness of the thin film is, leakage current characteristics deteriorate. To prevent the deterioration of the leakage current characteristics, a method of forming a thin film using a dielectric material having a large bandgap may be considered. However, since the bandgap of most dielectric materials is inversely related to the dielectric constant, a thin film that is formed using a dielectric material having a large bandgap may not be suitable for use in applicable fields, such as an electronic device. In addition, even when a thin film having ferroelectric properties is formed by a heat treatment, when the thickness of the thin film is small, the leakage current characteristic may deteriorate due to the grain boundary of the thin film.

In the ferroelectric thin-film structure 200 according to some example embodiments, the third atomic layer 230 including the first dielectric material 211 based on an oxide and the dopant 231, which has a bandgap greater than that of the first dielectric material 211, is formed by an ALD process, and thus, the ferroelectric thin-film structure 200 can be formed to have a very thin thickness and may have improved electrical properties such as leakage current characteristics and capacitance characteristics while retaining ferroelectric properties.

In some example embodiments described above, the third atomic layer 230 includes the first dielectric material 211 and the dopant 231. However, the present disclosure is not limited thereto, and the third atomic layer 230 may include the second dielectric material 221 and the dopant 231 having a bandgap greater than that of the second dielectric material 221. In one or more embodiments, the third atomic layer 230 may include the first dielectric material 211 and the second dielectric material 221, and the dopant 231 having a bandgap greater than that of each of the first dielectric material 211 and the second dielectric material 221.

In some example embodiments described above, the third atomic layer 230 includes only one type of dopant 231. However, the present disclosure is not limited thereto, and the third atomic layer 230 may include two or more kinds of dopants including different materials. In this case, one type of dopant may improve ferroelectric characteristics, and other types of dopant may improve electrical characteristics.

In some example embodiments described above, the first atomic layer 210 and the second atomic layers 220 include oxide-based different dielectric materials, that is, the first dielectric material 211 and the second dielectric material 221, respectively. However, the present disclosure is not limited thereto, and the first atomic layer 210 and the second atomic layers 220 may be the same atomic layers including the same oxide-based dielectric material. Restated, the first and second atomic layers 210 and 220 may be included in a plurality of atomic layers that each include an identical dielectric material. In this case, the third atomic layer 230 may include an oxide-based dielectric material constituting the first atomic layer 210 and the second atomic layers 220 and a dopant having a bandgap greater than that of the oxide-based dielectric material. For example, a ferroelectric thin-film structure may include the first atomic layer 210 and the second atomic layers 220, each including HfO, and the third atomic layer 230 including HfO and AlO. In this regard, AlO may improve the ferroelectric and electrical properties of the ferroelectric thin-film structure 200.

Figure 2:
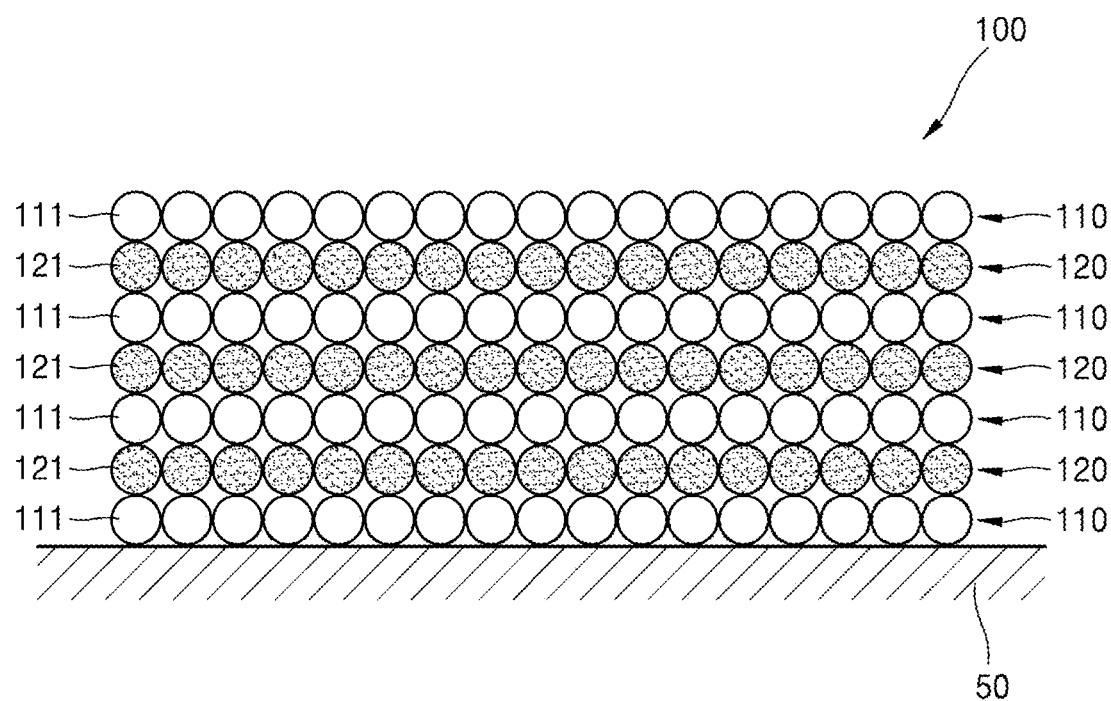
FIG. 2 illustrates a cross-section of a ferroelectric thin-film structure according to some example embodiments.

FIG. 2 shows a view of a ferroelectric thin-film structure according to some example embodiments.

Referring to FIG. 2, a ferroelectric thin-film structure 100 may include at least one first atomic layer 110 and at least one second atomic layer 120 alternately stacked on a substrate 50. In the example embodiments illustrated in FIG. 2, four first atomic layers 110 and three second atomic layers 120 are alternately stacked on the substrate 50.

The first atomic layer 110 may include a first dielectric material 111 based on an oxide, and the second atomic layer 120 may include a second dielectric material 121 based on an oxide. For example, the first atomic layer 110 may include HfO and the second atomic layer 120 may include ZrO. However, embodiments of the present disclosure are not limited thereto.

Figure 3:
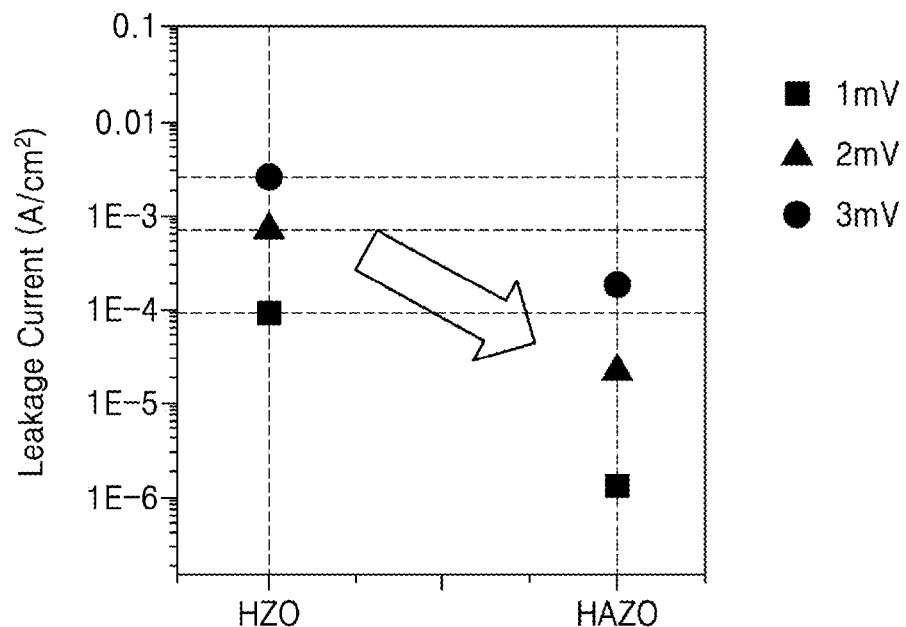
FIG. 3 shows the results obtained by comparing a leakage current characteristic of an electronic device using the ferroelectric thin-film structure illustrated in FIG. 2 with an electronic device using the ferroelectric thin-film structure according to the example embodiments illustrated in FIG. 1.

FIG. 3 shows a leakage current characteristic of an electronic device (for example, a memory device or a logic device) using the ferroelectric thin-film structure illustrated in FIG. 2 and an electronic device (for example, a memory device or a logic device) using the ferroelectric thin-film structure according to the example embodiments illustrated in FIG. 1.

Herein, in the ferroelectric thin-film structure 100 illustrated in FIG. 2, the first atomic layer 110 includes HfO, and the second atomic layer 120 includes ZrO. In the ferroelectric thin-film structure 200 according to some example embodiments illustrated in FIG. 1, the first atomic layer 210 includes HfO, the second atomic layer 220 includes ZrO, and the third atomic layer 230 includes HfO and AlO.

FIG. 3 shows leakage current characteristics when the gate voltage is 1 MV, 2 MV, and 3 MV. "HZO" represents the ferroelectric thin-film structure 100 illustrated in FIG. 2, and "HAZO" represents the ferroelectric thin-film structure 200 according to some example embodiments illustrated in FIG. 1. Referring to FIG. 3, it can be seen that the leakage current characteristic of the ferroelectric thin-film structure 200 according to some example embodiments illustrated in FIG. 1 is improved by about 100 times greater than that of the ferroelectric thin-film structure 100 illustrated in FIG. 2.

Figure 4:
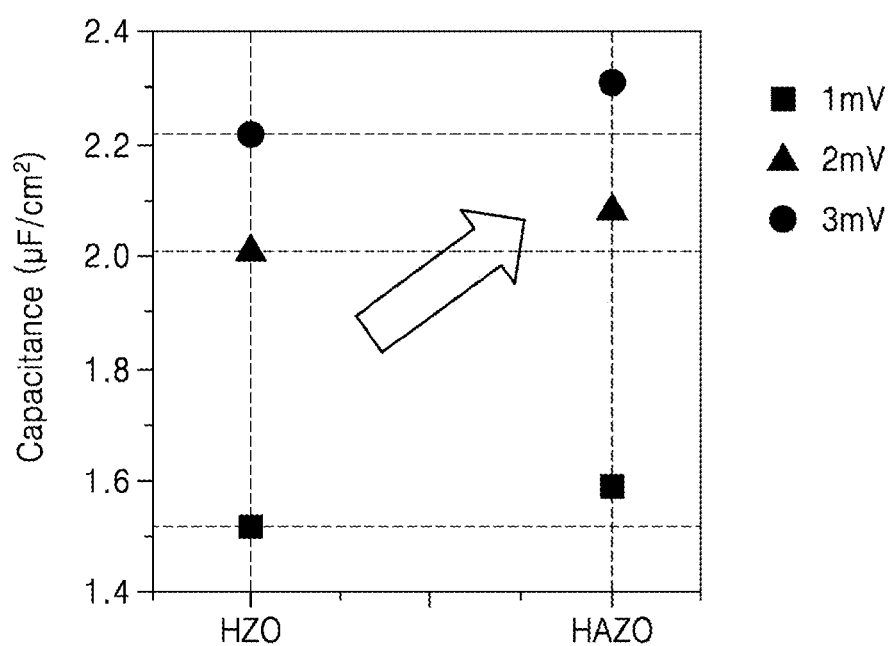
FIG. 4 shows the results obtained by comparing a capacitance characteristic of an electronic device using the ferroelectric thin-film structure illustrated in FIG. 2 with an electronic device using the ferroelectric thin-film structure according to the example embodiments illustrated in FIG. 1.

FIG. 4 shows the results obtained by comparing a capacitance characteristic of an electronic device (for example, a capacitor) using the ferroelectric thin-film structure 100 illustrated in FIG. 2 and an electronic device using a ferroelectric thin-film structure 200 according to some example embodiments illustrated in FIG. 1.

Herein, in the ferroelectric thin-film structure 100 illustrated in FIG. 2, the first atomic layer 110 includes HfO, and the second atomic layer 120 includes ZrO. In the ferroelectric thin-film structure 200 according to some example embodiments illustrated in FIG. 1, the first atomic layer 210 includes HfO, the second atomic layer 220 includes ZrO, and the third atomic layer 230 includes HfO and AlO.

FIG. 4 shows electric capacitance characteristics when the voltage between electrodes is 1 MV, 2 MV, and 3 MV. "HZO" represents the ferroelectric thin-film structure 100 illustrated in FIG. 2, and "HAZO" represents the ferroelectric thin-film structure 200 according to some example embodiments illustrated in FIG. 1. Referring to FIG. 4, it can be seen that the electric capacitance characteristic of the ferroelectric thin-film structure 200 according to some example embodiments illustrated in FIG. 1 is improved by about 4% compared with that of the ferroelectric thin-film structure 100 illustrated in FIG. 2.

FIGS. 5A to 5G are views illustrating a method of manufacturing a ferroelectric thin-film structure according to some example embodiments. Hereinafter, a method of forming a ferroelectric thin-film structure in which a first atomic layer 310 including a first dielectric material, a second atomic layer 320 including a second dielectric material, and a third atomic layer 330 including the first dielectric material and a dopant are sequentially stacked using an atomic layer deposition process, will be described. Herein, for convenience of description, it is assumed that the first dielectric material is HfO, the second dielectric material is ZrO, and the dopant is AlO. It will be understood that the first atomic layer 310, as described with reference to FIGS. 5A to 5G may have any of the properties of any of the first atomic layers described herein, including the first atomic layers 210, described with reference to FIG. 1. It will be understood that the second atomic layer 320, as described with reference to FIGS. 5A to 5G may have any of the properties of any of the second atomic layers described herein, including the second atomic layers 220, described with reference to FIG. 1. It will be understood that the third atomic layer 330, as described with reference to FIGS. 5A to 5G may have any of the properties of any of the third atomic layers described herein, including the third atomic layer 230, described with reference to FIG. 1.

Figure 5A:
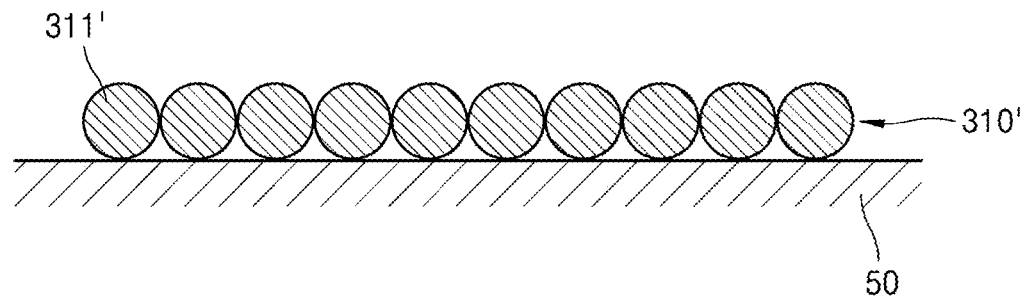
FIGS. 5A to 5G are views illustrating a method of manufacturing a ferroelectric thin-film structure according to some example embodiments.
Figure 5B:
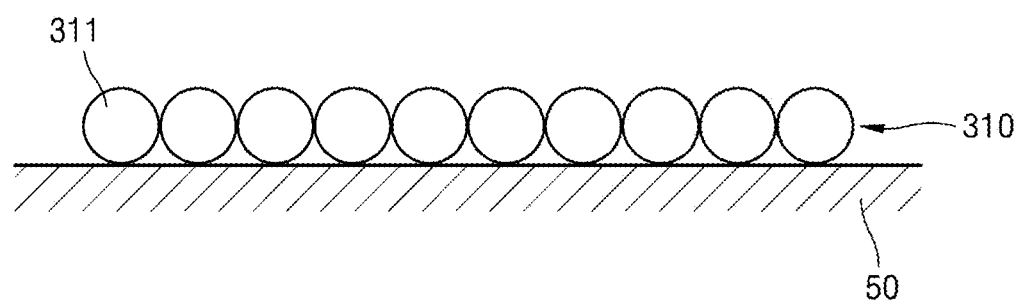

Referring to FIG. 5A, a first atomic material layer 310' including a Hf precursor 311' (a precursor of a first dielectric material) is formed on (e.g., directly on) a surface of a substrate 50 by supplying the Hf precursor 311' into a process chamber (not shown). The forming of the Hf precursor 311' may include supplying the Hf precursor 311' into a process chamber (not shown) to cause the Hf precursor 311' to be deposited on the substrate 50. Such supplying and depositing may be implemented via any known ALD operation for providing a precursor on to a substrate. Subsequently, referring to FIG. 5B, the first atomic layer 310 including HfO (311, the first dielectric material) is formed on (e.g., directly on) the surface of the substrate 50 by providing a certain oxidant (not shown) to the process chamber so that the oxidant is supplied to the Hf precursor 311' to cause the Hf precursor 311' to react with the oxidant. The supplying the oxidant into the process chamber to cause the reaction may be implemented via any known ALD operation for supplying an oxidant to react with a precursor. Accordingly, the first atomic layer 310 may be formed on (e.g., directly on) the surface of the substrate according to a first atomic layer deposition (ALD) operation (e.g., "process").

Figure 5C:
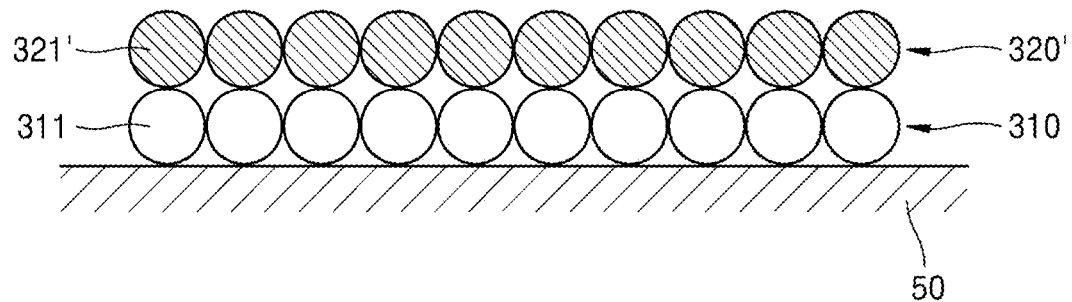
Figure 5D:
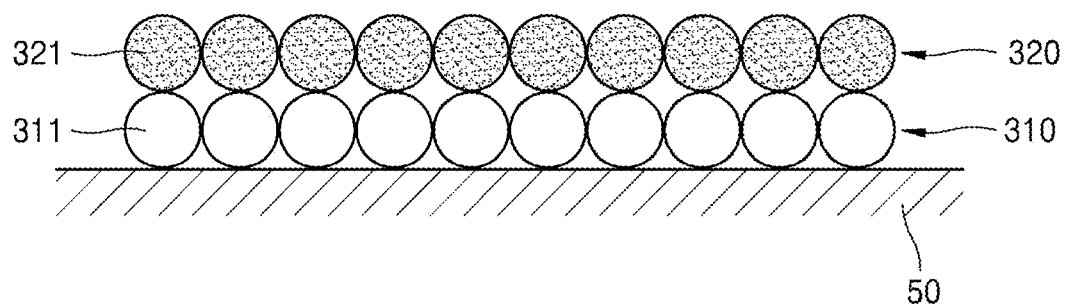

Referring to FIG. 5C, a second atomic material layer 320' including a Zr precursor 321' (a precursor of the second dielectric material) is formed on (e.g., directly on) the top surface of the first atomic layer 310 by supplying the Zr precursor 321' to the process chamber. The forming of the Zr precursor 321' may include supplying the Zr precursor 321' into the process chamber (not shown) to cause the Zr precursor 321' to be deposited on the first atomic layer 310. Such supplying and depositing may be implemented via any known ALD operation for providing a precursor onto a layer. Referring to FIG. 5D, the second atomic layer 320 including a ZrO 321 (the second dielectric material) is formed on (e.g., directly on) the top surface of the first atomic layer 310 by supplying a certain oxidant to the process chamber so that the Zr precursor 321' reacts with the oxidant. The supplying the oxidant into the process chamber to cause the reaction may be implemented via any known ALD operation for supplying an oxidant to react with a precursor. Accordingly, the second atomic layer 320 may be formed on (e.g., directly on) the top surface of the first atomic layer 310 according to a second atomic layer deposition (ALD) operation (e.g., "process").

Figure 5E:
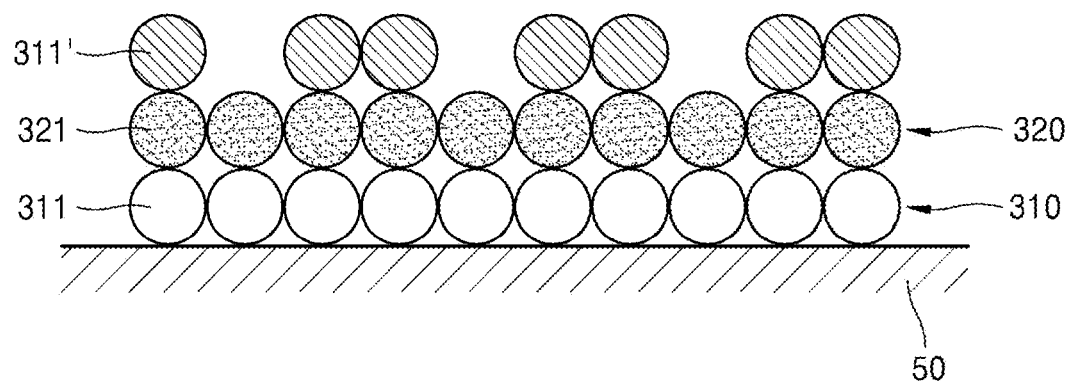
Figure 5F:
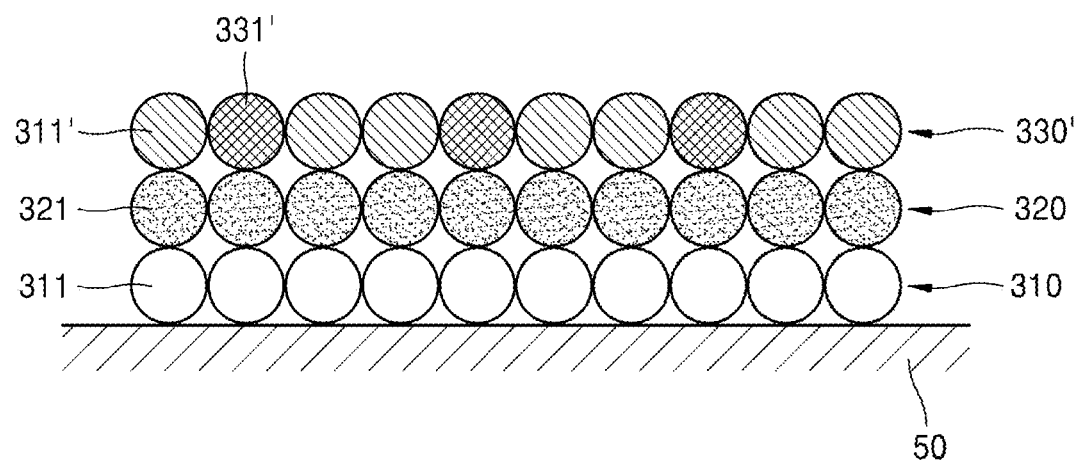

Referring to FIG. 5E, the Hf precursor 311' is supplied to the process chamber to form the Hf precursor 311' on the top surface of the second atomic layer 320. The forming of the Hf precursor 311' may include supplying the Hf precursor 311' into the process chamber (not shown) to cause the Hf precursor 311' to be deposited on at least a portion of the second atomic layer 320. Such supplying and depositing may be implemented via any known ALD operation for providing a precursor onto a layer. In this regard, the Hf precursor 311' is formed to cover a portion of the top surface of the second atomic layer 320, such that a portion of the top surface of the second atomic layer 320 is exposed by the Hf precursor 311'. Referring to FIG. 5F, an Al precursor 331' (a dopant precursor) is supplied to the process chamber to form the Al precursor 331' on the top surface of the second atomic layer 320. The forming of the dopant precursor may include supplying the dopant precursor into the process chamber (not shown) to cause the dopant precursor to be deposited on at least a portion of the second atomic layer 320 so as to cover the portions of the second atomic layer 320 not covered by the Hf precursor 311'. Such supplying and depositing may be implemented via any known ALD operation for providing a precursor onto a layer. In this regard, the Al precursor 331' is formed to cover the portions of the top surface of the second atomic layer 320 exposed by the Hf precursor 311'. Accordingly, a third atomic-layer 330' including the Hf precursor 311' and the Al precursor 331' is formed on the top surface of the second atomic layer 320.

Figure 5G:
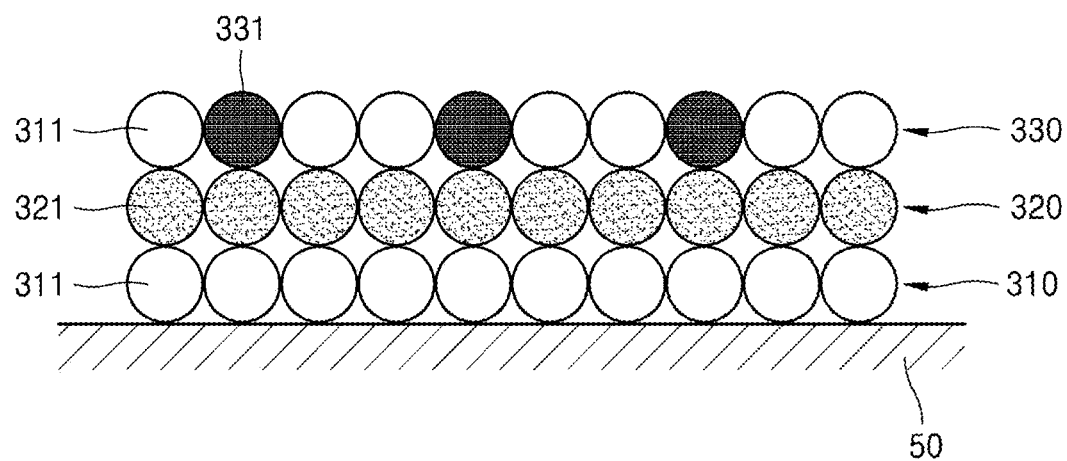

Referring to FIG. 5G, the third atomic layer 330 including a HfO 311 and an AlO 331 (a dopant) is formed on the top surface of the second atomic layer 320 by supplying a certain oxidant to the process chamber so that the Hf precursor 311' and the Al precursor 331' each react with the oxidant. The supplying the oxidant into the process chamber to cause the reaction may be implemented via any known ALD operation for supplying an oxidant to react with a precursor. Accordingly, the third atomic layer 330 may be formed on (e.g., directly on) the top surface of the second atomic layer 320 according to a third atomic layer deposition (ALD) operation (e.g., "process"). It will be understood that the third atomic layer 330 is formed indirectly on the first atomic layer 310, and thus the Hf precursor 311', in addition to exposing portions of the top surface of the second atomic layer 320, further indirectly exposes portions of the top surface of the first atomic layer 310, and the dopant precursor further covers those portions of the top surface of the first atomic layer 310 that are exposed by the Hf precursor 311'. Thereafter, a heat treatment process is performed on the structure shown in FIG. 5G (e.g., the first, second and/or third atomic layers 310, 320, 330) to crystallize the first atomic layer 310, the second atomic layer 320, and the third atomic layer 330, thereby completing the manufacture of a ferroelectric thin-film structure having ferroelectric properties.

In some example embodiments described above, the third atomic layer 330 includes the HfO 311 and the AlO 331. However, the present disclosure is not limited thereto, and the third atomic layer 330 may include ZrO 321 and AlO 331. In this case, the third atomic layer 330 may be formed by forming the Zr precursor 321' and the Al precursor 331', and then reacting the same with an oxidant. In one or more embodiments, the third atomic layer 330 may include the HfO 311, the ZrO 321, and the AlO 331. In this case, the third atomic layer 330 may be formed by forming the Hf precursor 311', the Zr precursor 321' and the Al precursor 331', and then reacting the same with an oxidant.

In the above description, a case in which a single first atomic layer, a single second atomic layer, and a single third atomic layer are formed on the substrate 50 has been described as an example. However, in one or more embodiments, at least one first atomic layer, at least one second atomic layer, and at least one third atomic layer may be formed.

In the previous embodiments, the first atomic layer 310 and the second atomic layer 320 include HfO and ZrO, respectively. However, in one or more embodiments, the first atomic layer 310 and the second atomic layer 320 may include ZrO and HfO, respectively. In one or more embodiments, the first atomic layer 310 and the second atomic layer 320 may each include the same material. In one or more embodiments, the first atomic layer 310 and the second atomic layer 320 may each include HfO. In one or more embodiments, the first atomic layer 310 and the second atomic layer 320 may each include ZrO.

In the previous embodiments, the first atomic layer 310 and the second atomic layer 320 are formed on the substrate 50, and then, the third atomic layer 330 was formed on the resultant structure. However, the present disclosure is not limited thereto, and the third atomic layer 330 may be formed on the substrate 50, and then the first atomic layer 310 and the second atomic layer 320 may be formed thereon. In one or more embodiments, the first atomic layer 310 is formed on the substrate 50, and then, the third atomic layer 330 is formed thereon (e.g., directly on the first atomic layer 310 according to the third ALD process described above with reference to FIGS. 5E-5G) and then, the second atomic layer 320 may be formed on the third atomic layer 330 or may be omitted.

In some example embodiments described above, the third atomic layer 330 includes only one type of dopant 331. However, the present disclosure is not limited thereto, and the third atomic layer 330 may include two or more kinds (e.g., types) of dopants including different materials. For example, when the third atomic layer 330 includes a dielectric material and different kinds of first and second dopants, the third atomic layer 330 may be formed by forming a precursor of the dielectric material, a precursor of the first dopant, and a precursor of the second dopant on the second atomic layer 320 and then reacting the same with an oxidant.

Figure 6:
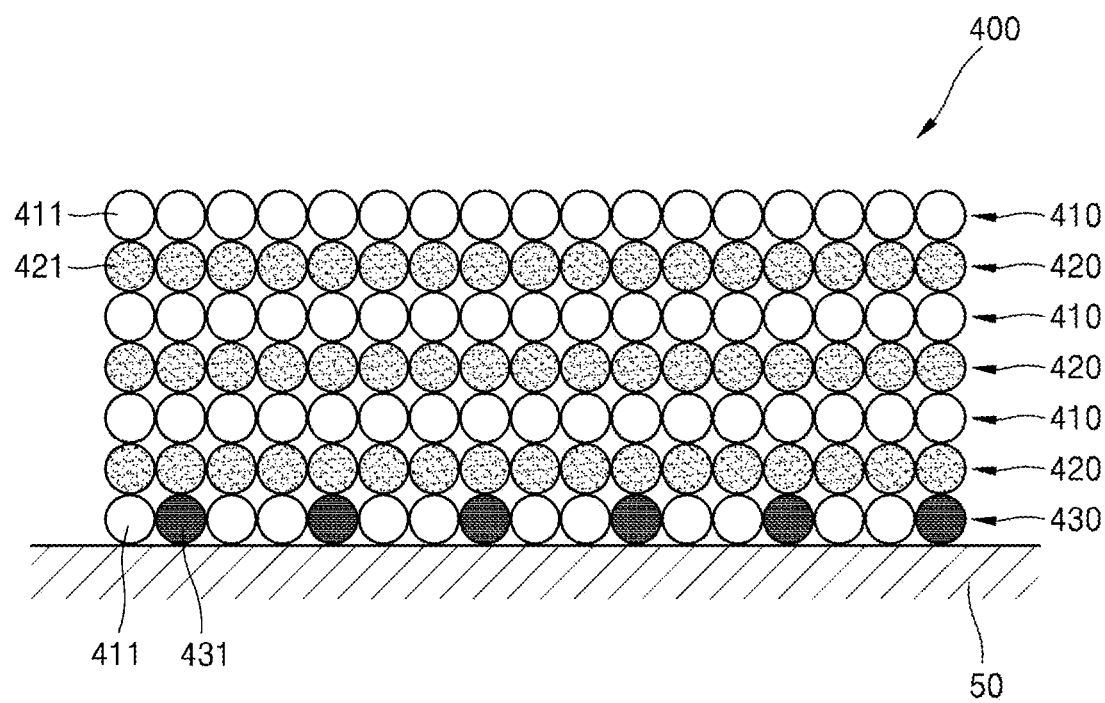
FIG. 6 illustrates a cross-section of a ferroelectric thin-film structure according to some example embodiments.

FIG. 6 illustrates a cross-section of a ferroelectric thin-film structure 400 according to some example embodiments. The ferroelectric thin-film structure 400 shown in FIG. 6 is the same as the ferroelectric thin-film structure 200 shown in FIG. 1, except that a third atomic layer 430 at least partially comprises (e.g., is located in) the lowermost portion of the ferroelectric thin-film structure 400 (e.g., the portion that is proximate to substrate 50), in contrast to the ferroelectric thin-film structure 200 shown in FIG. 1 where the third atomic layer 230 is located in (e.g., at least partially comprises) the uppermost portion of the ferroelectric thin-film structure 200 (e.g., the portion that is distal to substrate 50).

Referring to FIG. 6, the ferroelectric thin-film structure 400 includes a plurality of atomic layers stacked on the substrate 50. The ferroelectric thin-film structure 400 may have a thickness of, for example, about 0.1 nm to about 2 nm, but the thickness thereof is not limited thereto.

The ferroelectric thin-film structure 400 includes at least one first atomic layer 410, at least one second atomic layer 420, and the third atomic layer 430. The third atomic layer 430 may constitute the lowermost portion of the ferroelectric thin-film structure 400. That is, the third atomic layer 430 is provided on a top surface of the substrate 50. The at least one first atomic layer 410 and the at least one second atomic layer 420 are alternately stacked on the third atomic layers 430.

The first atomic layer 410 may include a first dielectric material 411 based on an oxide. The second atomic layer 420 may include a second dielectric material 421 based on an oxide that is different from the oxide on which the first atomic layer 410 is based. The first dielectric material 411 and the second dielectric material 421 may include, for example, a high-k material. The first dielectric material 411 and the second dielectric material 421 may include, for example, an oxide of at least one of hafnium (Hf), zirconium (Zr), or aluminum (Al), or a perovskite of at least one of hafnium (Hf), zirconium (Zr), or aluminum (Al). However, embodiments of the present disclosure are not limited thereto.

The third atomic layer 430 may include the first dielectric material 411 and a dopant 431 having a bandgap greater than that of the first dielectric material 411. In the third atomic layer 430, the first dielectric material 411 is provided to partially cover the top surface of the substrate 50, and the dopant 431 is provided to cover the top surface of the substrate 50 exposed by the first dielectric material 411. In this regard, the content ratio of the first dielectric material 411 and the dopant 431 constituting the third atomic layer 430 may vary. The dopant 431 included in the third atomic layer 430 may include, for example, at least one oxide of Si, Hf, Zr, Al, La, Y, Sr, or Gd. However, embodiments of the present disclosure are not limited thereto.

In the ferroelectric thin-film structure 400 according to some example embodiments, the third atomic layer 430 including the first dielectric material 411 based on an oxide and the dopant 431, which has a bandgap greater than that of the first dielectric material 411, is formed by an ALD process, and thus, the ferroelectric thin-film structure 400 may be formed to have a very thin thickness and may have improved electrical properties such as leakage current characteristics and electric capacitance characteristics while retaining ferroelectric properties.

In the previous embodiments, the third atomic layer 430 includes the first dielectric material 411 and the dopant 431. However, in one or more embodiments, the third atomic layer 430 may include the second dielectric material 421 and the dopant 431 having a bandgap greater than that of the second dielectric material 421. In one or more embodiments, the third atomic layer 430 may include the first dielectric material 411 and the second dielectric material 421, and the dopant 431 having a bandgap greater than that of each of the first dielectric material 411 and the second dielectric material 421.

In the previous embodiments, the third atomic layer 430 includes only one type of dopant 431. However, in one or more embodiments, the third atomic layer 430 may include two or more types of dopants including different materials. In the previous embodiments, the first atomic layer 410 and the second atomic layer 420 include different dielectric materials. However, in one or more embodiments, the first atomic layer 410 and the second atomic layer 420 may include the same dielectric material.

Figure 7:
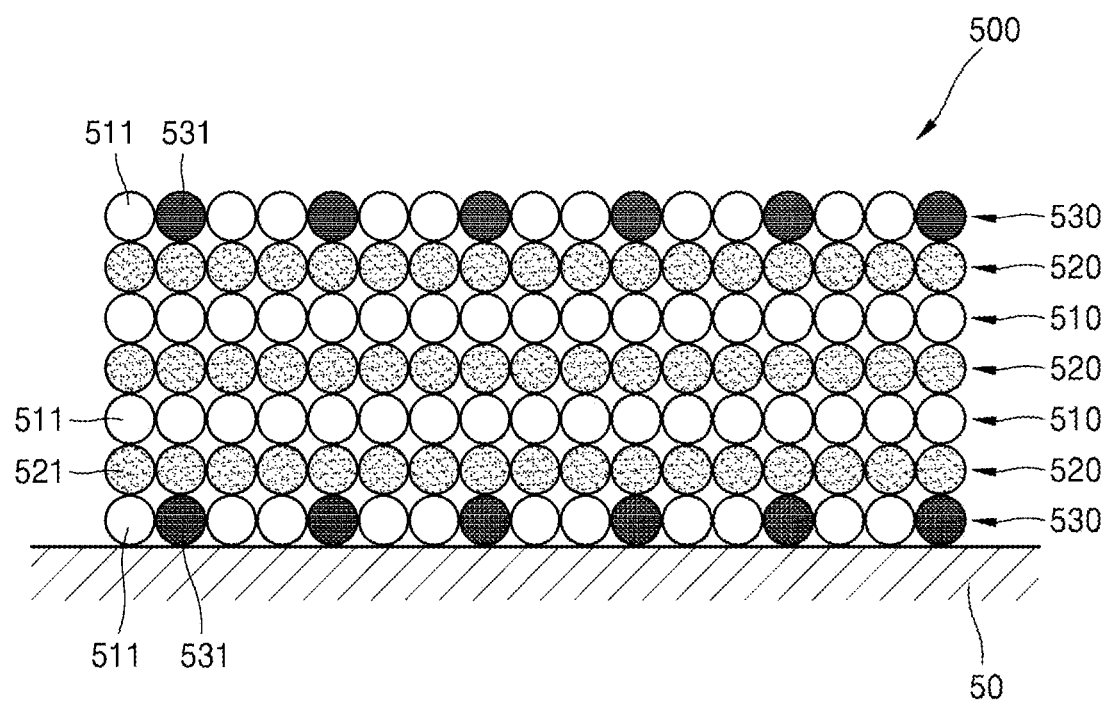
FIG. 7 illustrates a cross-section of a ferroelectric thin-film structure according to some example embodiments.

FIG. 7 illustrates a cross-section of a ferroelectric thin-film structure 500 according to some example embodiments. The ferroelectric thin-film structure 500 shown in FIG. 7 is the same as the ferroelectric thin-film structure 200 shown in FIG. 1, except that third atomic layers 530 constitute the lowermost and uppermost portions of the ferroelectric thin-film structure 500.

Referring to FIG. 7, the ferroelectric thin-film structure 500 includes at least one first atomic layer 510, at least one second atomic layer 520, and a plurality of third atomic layers 530. The third atomic layers 530 may at least partially comprise both the lowermost and uppermost portions of the ferroelectric thin-film structure 500. The at least one first atomic layer 510 and the at least one second atomic layer 520 are alternately stacked between the third atomic layers 530.

The first atomic layer 510 may include a first dielectric material 511 based on an oxide. The second atomic layer 520 may include a second dielectric material 521 based on an oxide that is different from the oxide on which the first atomic layer 510 is based. The first dielectric material 511 and the second dielectric material 521 may include, for example, an oxide of at least one of hafnium (Hf), zirconium (Zr), or aluminum (Al), or a perovskite of at least one of hafnium (Hf), zirconium (Zr), or aluminum (Al), but embodiments are not limited thereto.

Each of the third atomic layers 530 may include the first dielectric material 511 and a dopant 531 having a bandgap greater than that of the first dielectric material 511. In the third atomic layer 530 constituting the lowermost portion of the ferroelectric thin-film structure 500, the first dielectric material 511 is provided to partially cover the top surface of the substrate 50, and the dopant 531 is provided to cover the top surface of the substrate 50 exposed by the first dielectric material 511. In the third atomic layer 530 constituting the uppermost portion of the ferroelectric thin-film structure 500, the first dielectric material 511 is provided to partially cover the top surface of the second atomic layer 520, and the dopant 531 is provided to cover the top surface of the second atomic layer 520 exposed by the first dielectric material 511. The dopant 531 included in the third atomic layer 530 may include, for example, at least one oxide of Si, Hf, Zr, Al, La, Y, Sr, or Gd. However, embodiments of the present disclosure are not limited thereto.

Figure 8:
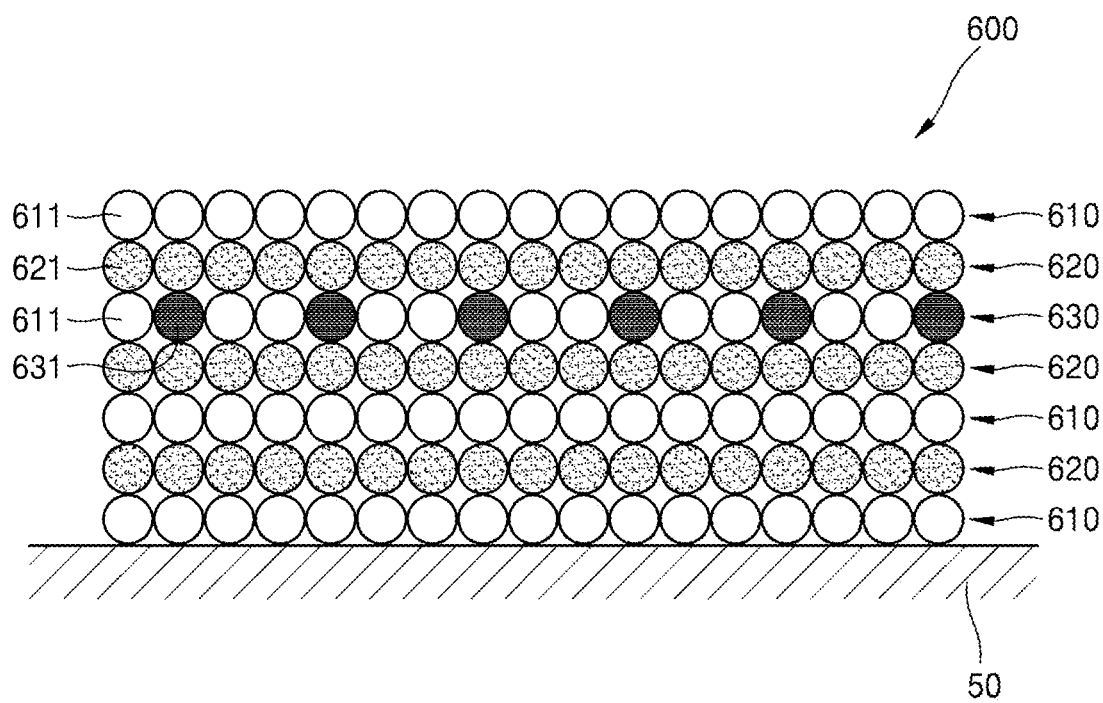
FIG. 8 illustrates a cross-section of a ferroelectric thin-film structure according to some example embodiments.

FIG. 8 illustrates a cross-section of a ferroelectric thin-film structure 600 according to some example embodiments. The ferroelectric thin-film structure 600 shown in FIG. 8 is the same as the ferroelectric thin-film structure 200 shown in FIG. 1, except that a third atomic layer 630 at least partially comprises (e.g., is located at) the middle portion of the ferroelectric thin-film structure 600, such that the third atomic layer 630 is located between at least two layers, the at least two layers including at least one first atomic layer 610 and/or at least one second atomic layer 620.

Referring to FIG. 8, the ferroelectric thin-film structure 600 includes at least one first atomic layer 610, at least one second atomic layer 620, and the third atomic layer 630. In this regard, the third atomic layer 630 may constitute the middle portion of the ferroelectric thin-film structure 600.

The first atomic layer 610 may include a first dielectric material 611 based on an oxide. The second atomic layer 620 may include a second dielectric material 621 based on an oxide that is different from the oxide on which the first atomic layer 610 is based. The third atomic layer 630 may include the first dielectric material 611 and a dopant 631 having a bandgap greater than that of the first dielectric material 611. Although in the example embodiments illustrated in FIG. 8, a single third atomic layer is provided in the middle portion of the ferroelectric thin-film structure 600, the present disclosure is not limited thereto, and a plurality of third atomic layers 630 may be provided in the middle portion of the ferroelectric thin-film structure 600.

Figure 9:
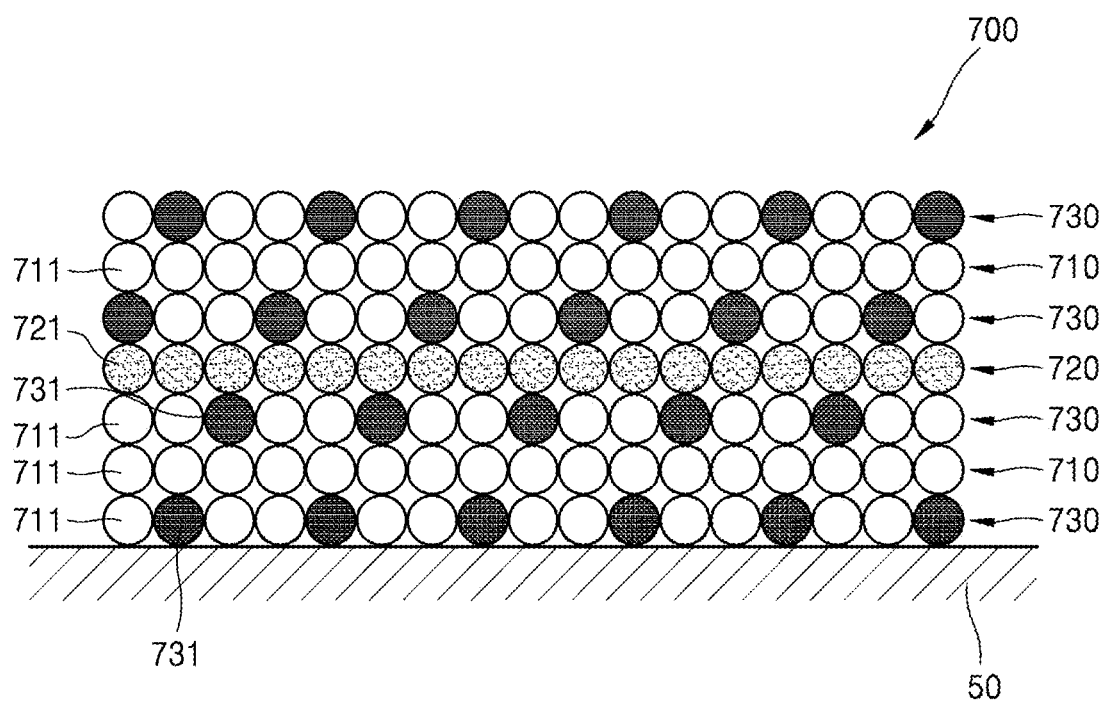
FIG. 9 illustrates a cross-section of a ferroelectric thin-film structure according to some example embodiments.

FIG. 9 illustrates a cross-section of a ferroelectric thin-film structure 700 according to some example embodiments. The ferroelectric thin-film structure 700 shown in FIG. 9 is the same as the ferroelectric thin-film structure 200 shown in FIG. 1, except that a plurality of third atomic layers 730 are distributed throughout the ferroelectric thin-film structure 700.

Referring to FIG. 9, the ferroelectric thin-film structure 700 includes at least one first atomic layer 710, at least one second atomic layer 720, and the third atomic layers 730. The third atomic layers 730 are regularly or irregularly arranged throughout the ferroelectric thin-film structure 700. The arrangement of the third atomic layers 730 may be variously modified.

The first atomic layer 710 may include a first dielectric material 711 based on an oxide. The second atomic layer 720 may include a second dielectric material 721 based on an oxide that is different from the oxide on which the first atomic layer 710 is based. The third atomic layer 730 may include the first dielectric material 711 and a dopant 731 having a bandgap greater than that of the first dielectric material 711.

Hereinafter, an electronic device using the ferroelectric thin film structure according to example embodiments described above will be described.

Figure 10:
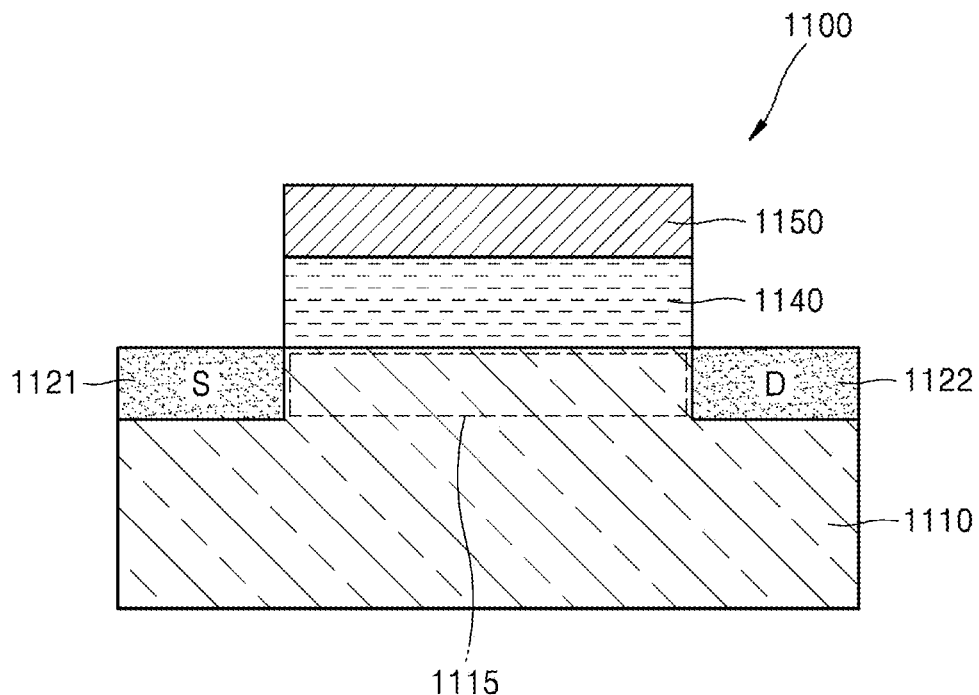
FIG. 10 illustrates a cross-section of an electronic device according to some example embodiments.

FIG. 10 illustrates a cross-section of an electronic device 1100 according to some example embodiments. The electronic device 1100 shown in FIG. 10 may be, for example, a memory device or a logic device.

Referring to FIG. 10, the electronic device 1100 includes a substrate 1110, and a ferroelectric layer 1140 and a gate electrode 1150 sequentially stacked on the substrate 1110. It will be understood that the gate electrode 1150 is on (e.g., indirectly on) the substrate 1110 and the ferroelectric layer 1140 is between the substrate 1110 and the gate electrode 1150. In the substrate 1110, a channel element 1115 is provided at a position thereof corresponding to the gate electrode 1150 (e.g., vertically overlapping with the gate electrode 1150, as shown in FIG. 10), and a source S 1121 and a drain D 1122 may be provided at opposite sides of the channel element 1115, as shown in FIG. 10. As shown in FIG. 10, the channel element 1115 may be a protruding structure of the substrate 1110.

The source S 1121 may be electrically connected to one side of the channel element 1115, and the drain D 1122 may be electrically connected to the other side of channel element 1115. The source S 1121 and the drain D 1122 may be formed by implanting impurities into different regions of the substrate 1110, and a region of the substrate 1110 between the source S 1121 and the drain D 1122 may be defined as the channel element 1115.

The substrate 1110 may be, for example, a Si substrate, but may instead be a substrate including materials other than Si, such as Ge, SiGe, a III-V semiconductor, and the like. In this case, the channel element 1115 may include Si, Ge, SiGe, or III-V group semiconductors. Restated, the substrate 1110, and thus the channel element 1115, may include at least one of Si, Ge, SiGe, III-V semiconductors, oxide semiconductors, nitride semiconductors, oxynitride semiconductors, 2-dimensional (2D) materials, quantum dots, or organic semiconductors. However, this is merely an example, and the material of the substrate 1110 may be variously changed without being limited to the above. On the other hand, like the following embodiments, the channel element 1115 may be formed as a material layer that is separate from the substrate 1110, not as being a part of the substrate 1110.

The ferroelectric layer 1140 may be provided on a top surface of the channel element 1115 of the substrate 1110. In this regard, the ferroelectric layer 1140 is manufactured by an atomic layer deposition (ALD) process, and may have, for example, a thickness of about 0.1 nm to 2 nm, but is not limited thereto.

The ferroelectric layer 1140 may be any one of the ferroelectric thin-film structures 200, 400, 500, 600, or 700 according to the above-described embodiments. The ferroelectric layer 1140 may include at least one first atomic layer including an oxide based dielectric material and at least one second atomic layer including a dielectric material and a dopant. At least one second atomic layer may constitute at least one of the uppermost portion, the middle portion, and the lowermost portion of the ferroelectric layer 1140.

At least one first atomic layer may include a plurality of atomic layers including different dielectric materials. At least one first atomic layer may include a plurality of atomic layers, each including the same dielectric material. The dielectric material included in the first atomic layer may include, for example, a high-k material. For example, the first atomic layer may include, but is not limited to, an oxide of at least one of Hf, Zr, or Al, or a perovskite of at least one of hafnium (Hf), zirconium (Zr), or aluminum (Al).

The second atomic layer may include a dielectric material as described above and a dopant having a bandgap greater than this dielectric material. In this regard, the dopant may include, for example, an oxide of at least one of silicon (Si), hafnium (Hf), zirconium (Zr), aluminum (Al), lanthanum (La), yttrium (Y), strontium (Sr), or gadolinium (Gd), but embodiments are not limited thereto.

The gate electrode 1150 is provided on a top surface of the ferroelectric layer 1140. In this regard, the gate electrode 1150 may be arranged to face the channel element 1115 of the substrate 1110. The gate electrode 1150 may include a conductive material.

In the electronic device 1100 according to some example embodiments, the ferroelectric layer 1140 may have a small thickness due to the inclusion of a dielectric material and a dopant having a greater bandgap than that of the dielectric material, and the leakage current characteristic may be improved while ferroelectric characteristics are maintained.

Figure 11:
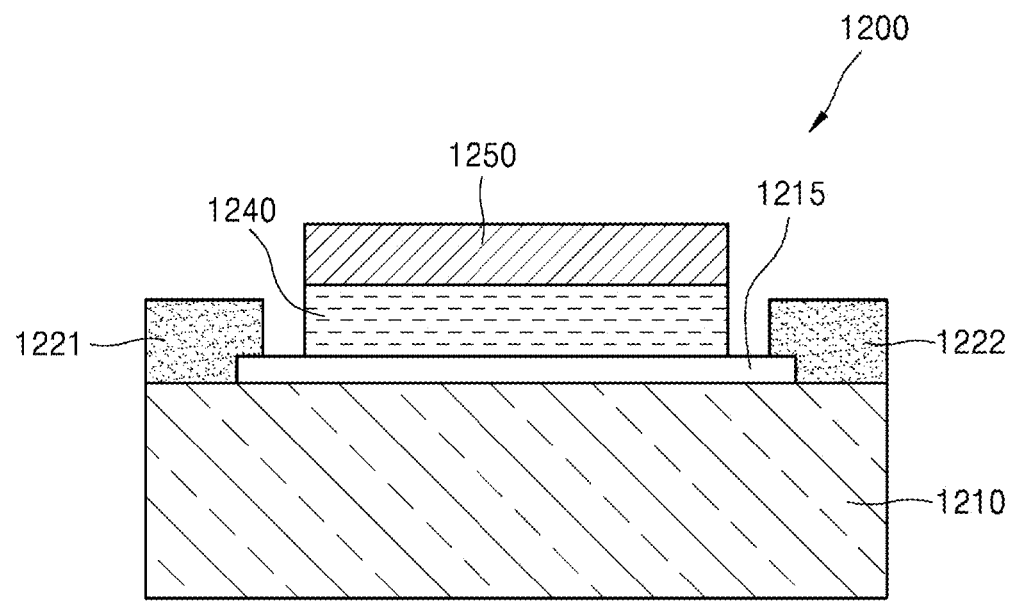
FIG. 11 illustrates a cross-section of an electronic device according to some example embodiments.

FIG. 11 illustrates a cross-section of an electronic device 1200 according to some example embodiments. The electronic device 1200 shown in FIG. 11 may be, for example, a memory device or a logic device.

Referring to FIG. 11, the electronic device 1200 includes a substrate 1210, and a channel element 1215, a ferroelectric layer 1240, and a gate electrode 1250, which are sequentially stacked in this stated order on the substrate 1210. A source electrode 1221 and a drain electrode 1222 may be provided at both sides of the channel element 1215.

The substrate 1210 may include, but is not limited to, Si, Ge, SiGe, III-V semiconductors, and the like. The channel element 1215 may be provided on a top surface of the substrate 1210. The channel element 1215 may be provided as a material layer that is separate from the substrate 1210, that is, not being a part of the substrate 1210. The channel element 1215 may include, for example, at least one of an oxide semiconductor, a nitride semiconductor, an oxynitride semiconductor, a two-dimensional material (2D material), a quantum dot, or an organic semiconductor. In this regard, the oxide semiconductor may include, for example, InGaZnO, the two-dimensional material may include, for example, transition metal dichalcogenide (TMD) or graphene, and the quantum dots may include, for example, colloidal QDs or nanoparticles. However, this is merely an example and is not limited.

A source electrode 1221 and a drain electrode 1222 may be provided at both sides of the channel element 1215. The source electrode 1221 may be provided to be connected to one side of the channel element 1215, and the drain electrode 1222 may be provided to be connected to the other side of the channel element 1215. The source electrode 1221 and the drain electrode 1222 may include a conductive material, such as a metal, a metal compound, or a conductive polymer.

The ferroelectric layer 1240 may be provided on the top surface of the channel element 1215, and the gate electrode 1250 may be provided on the top surface of the ferroelectric layer 1240. In this regard, since the ferroelectric layer 1240 and the gate electrode 1250 are the same as the ferroelectric layer and the gate electrode in the above-described embodiments, a detailed description thereof will be omitted.

Figure 12:
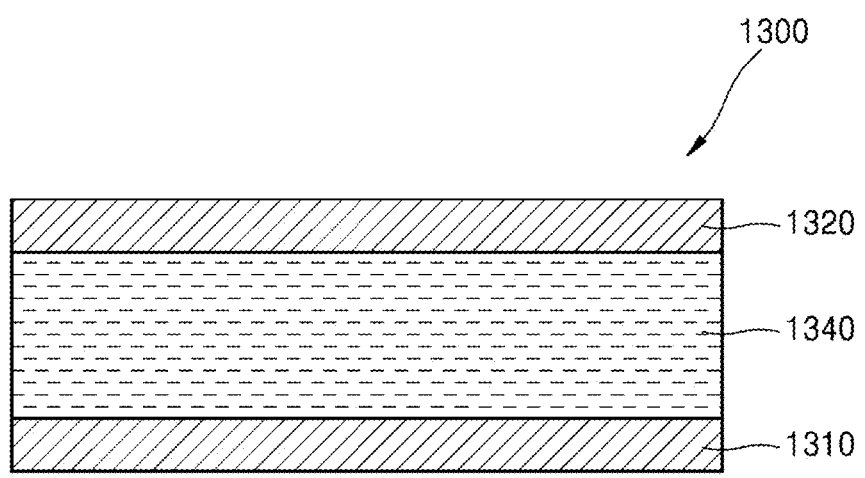
FIG. 12 illustrates a cross-section of an electronic device according to some example embodiments.

FIG. 12 illustrates a cross-section of an electronic device 1300 according to some example embodiments. The electronic device 1300 shown in FIG. 12 may be, for example, a capacitor.

Referring to FIG. 12, the electronic device 1300 may include a first electrode 1310 and a second electrode 1320 spaced apart from each other (e.g., isolated from direct contact with each other), and a ferroelectric layer 1340 provided between the first electrode 1310 and the second electrode 1320. In this regard, the first electrode 1310 and the second electrode 1320 may each include, for example, a conductive metal.

The ferroelectric layer 1340 is manufactured by an ALD process and may be one of the ferroelectric thin-film structures 200, 400, 500, 600, or 700 according to the above-described embodiments. The ferroelectric layer 1340 may include at least one first atomic layer including an oxide based dielectric material and at least one second atomic layer including a dielectric material and a dopant. At least one second atomic layer may constitute at least one of the uppermost portion, the middle portion, and the lowermost portion of the ferroelectric layer 1340.

At least one first atomic layer may include a plurality of atomic layers including different dielectric materials. At least one first atomic layer may include a plurality of atomic layers, each including the same dielectric material. The dielectric material included in the first atomic layer may include, for example, a high-k material. For example, the first atomic layer may include, but is not limited to, an oxide or perovskite of at least one of Hf, Zr, or Al.

The second atomic layer may include a dielectric material as described above and a dopant having a bandgap greater than this dielectric material. In this regard, the dopant may include, for example, an oxide of at least one of silicon (Si), hafnium (Hf), zirconium (Zr), aluminum (Al), lanthanum (La), yttrium (Y), strontium (Sr), or gadolinium (Gd), but embodiments are not limited thereto.

In the electronic device 1300 according to some example embodiments, the ferroelectric layer 1340 may improve electric capacitance characteristics while maintaining ferroelectric characteristics due to the inclusion of a dielectric material and a dopant having a greater bandgap than that of the dielectric material.

Figure 13:
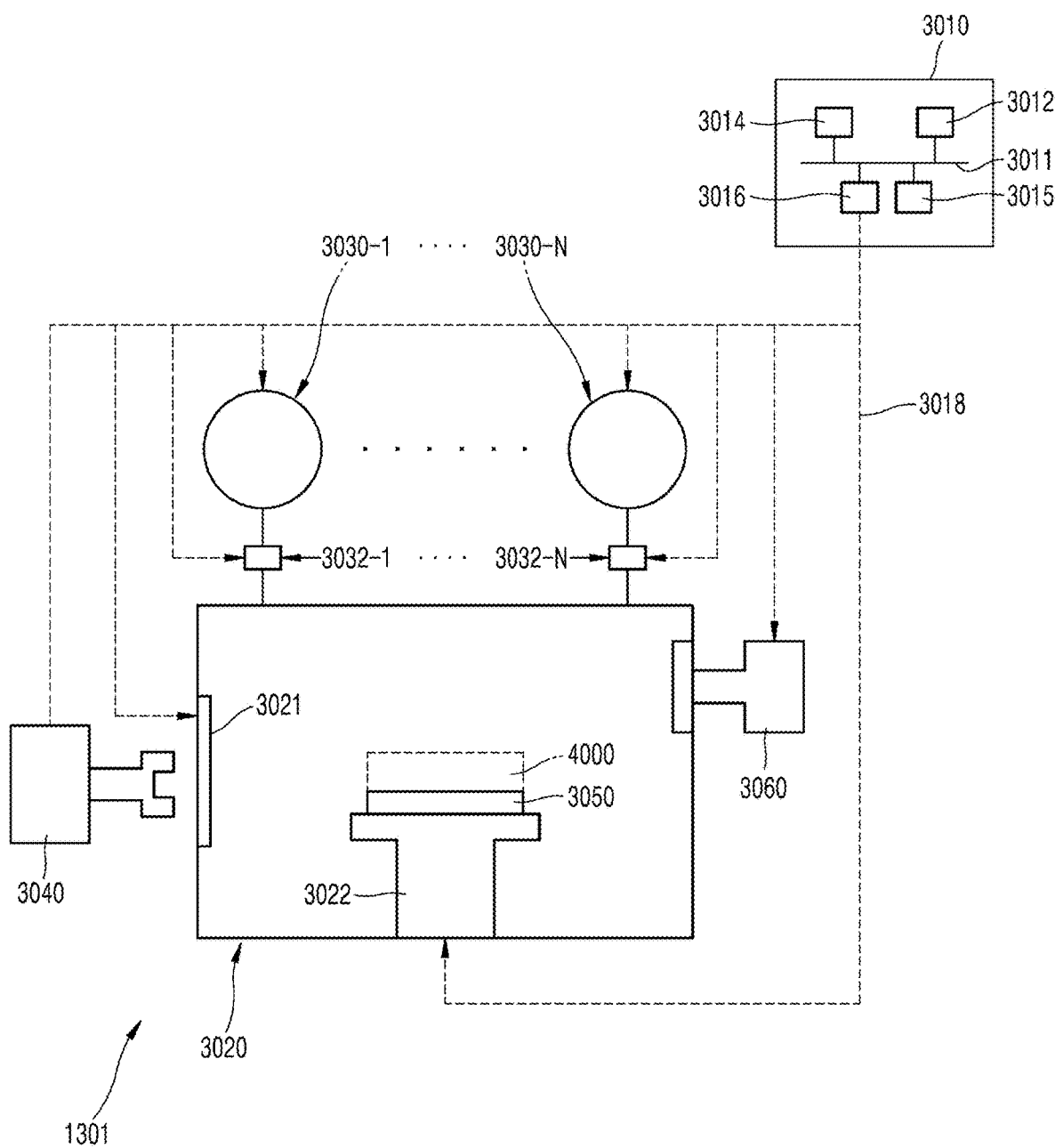
FIG. 13 shows a schematic of a system configured to control the formation of a ferroelectric thin film structure according to some example embodiments.

FIG. 13 shows a schematic of a system 1301 configured to control the formation of a ferroelectric thin film structure according to some example embodiments. As used herein, a system 1301 may be referred to as a "set."

Referring to FIG. 13, system 1301 includes a computing device 3010 (also referred to herein interchangeably as an electronic device), a manipulator device 3040, a heat source 3060, composition (e.g., gas, fluid, etc.) sources 3030-1 to 3030-N (where N is a positive integer), and a process chamber 3020.

Referring first to the computing device 3010, the computing device 3010 may include processing circuitry 3012 (also referred to herein as simply a processor), memory 3014, a power supply 3015, and a communication interface 3016 that are communicatively and/or electrically coupled together via a bus 3011.

The computing device 3010 may be included in one or more various electronic devices, including, for example, a mobile phone, a digital camera, a sensor device, or the like. In some example embodiments, the computing device 3010 may include one or more of a server, a mobile device, a personal computer (PC), a tablet computer, a laptop computer, a netbook, some combination thereof, or the like. A mobile device may include a mobile phone, a smartphone, a personal digital assistant (PDA), some combination thereof, or the like.

The memory 3014, the processing circuitry 3012, the power supply 3015, and the communication interface 3016 may communicate with one another through the bus 3011.

The communication interface 3016 may communicate data to and/or from an external device using various communication protocols. In some example embodiments, the communication interface may be connected to an electronic line (e.g., wire) and may be configured to receive and process electrical signals from one or more external devices.

The processing circuitry 3012 may execute a program and control one or more aspects of the system 1301, via the communication interface 3016 as shown in FIG. 13. A program code to be executed by the processing circuitry 3012 may be stored in the memory 3014.

The memory 3014 may store information. The memory 3014 may be a volatile or a nonvolatile memory. The memory 3014 may be a non-transitory computer readable storage medium. The memory may store computer-readable instructions that, when executed, cause the execution of one or more methods, functions, processes, etc. as described herein. In some example embodiments, the processing circuitry 3012 may execute one or more of the computer-readable instructions stored at the memory 3014 to cause the system 1301 to perform some of all of the methods described herein, including the method illustrated in FIGS. 5A-5G.

In some example embodiments, the communication interface 3016 may include a USB and/or HDMI interface. In some example embodiments, the communication interface 2050 may include a wireless communication interface.

Still referring to FIG. 13, the process chamber 3020 may be any of the process chambers described herein and may include a pedestal and/or chuck 3022 that is configured to structurally support a substrate 3050 upon which a ferroelectric thin-film structure 4000 (which may be any of the example embodiments of ferroelectric layers described herein) according to any of the example embodiments may be formed. As shown, the pedestal and/or chuck 3022 may be coupled to a motor such that the electronic device 3010 may be configured to cause the pedestal and/or chuck 3022 to move, via control signals communicated from communication interface 3016, for example to enable the substrate 3050 and/or ferroelectric thin-film structure 4000 to me moved within, into, and/or out of the process chamber 3020.

Still referring to FIG. 13, system 1301 includes a manipulator device 3040, which may be any well-known device for manipulating thin-film structures and/or substrates into and/or out of a process chamber 3020, and the process chamber 3020 may include a portal (e.g., door) 3021 via which the manipulator device 3040 may access the interior of the process chamber 3020 to provide a substrate 3050 and/or to retrieve at least a ferroelectric thin-film structure 4000 formed therein. As shown, the manipulator device 3040 and the portal 3021 may be controlled by the electronic device 3010.

Still referring to FIG. 13, the system 1301 includes one or more composition sources 3030-1 to 3030-N (N being a positive integer) which may store various materials, including a first dielectric material, a second dielectric material, a first dielectric material precursor, a second dielectric material precursor, a dopant precursor, a oxidant, any other material and/or composition described herein, or any combination thereof, as described herein. The materials may be stored as a gas, as a liquid, as any type of fluid, or any combination thereof. As shown, each separate composition source is coupled to the process chamber 3020 via a separate supply control device (e.g., control valve) 3032-1 to 3032-N, where each control device 3032-1 to 3032-N is configured (e.g., based on being a control valve) to control a supply of a separate material held in a separate (e.g., corresponding) coupled composition source 3030-1 to 3030-N to the process chamber. The composition sources 3030-1 to 3030-N and/or control devices 3032-1 to 3032-N may be controlled by electronic device 3010. The composition sources 3030-1 to 3030-N and control devices 3032-1 to 3032-N may be any well-known type of composition source or supply system used to supply materials to a process chamber in an ALD process.

Still referring to FIG. 13, system 1301 includes a heat source 3060, which may be any well-known heating device, heating element, heater, or the like that may be utilized to generate heat and provide the generated heat to the process chamber 3020 (e.g., to heat at least a portion of the process chamber 3020), for example provide a heat treatment in association with an ALD process, as described herein. As shown, the heat source 3060 may be controlled by the electronic device 3010.

As shown in FIG. 13, the electronic device 3010 may, for example based on processing circuitry 3012 executing a program of instruction stored on memory 3014, communicate with various elements of the system 1301 via communication lines 3018 to cause the system 1301 to form a ferroelectric thin-film structure 4000 according to any example embodiments herein. It will be understood that the system 1301 may omit one or more of the elements shown in FIG. 13 (e.g., the heat source 3060, the pedestal or chuck 3022, or the like).

Figure 14:
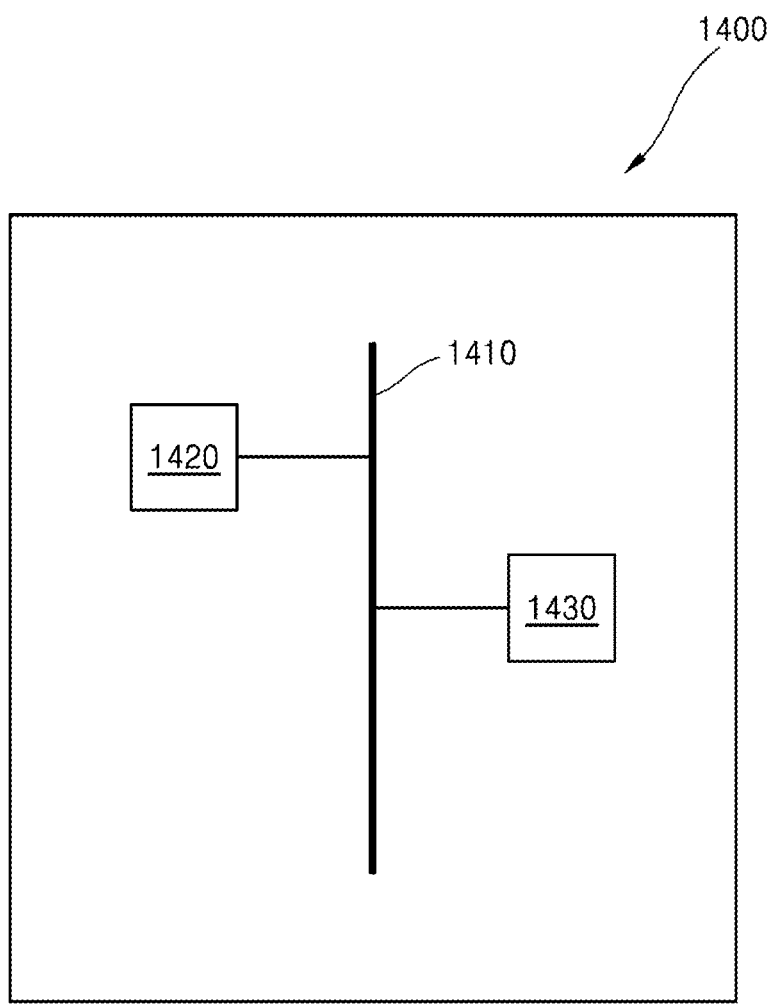
FIG. 14 shows a schematic of an electronic device that may include the ferroelectric thin-film structure according to some example embodiments.

FIG. 14 shows a schematic of an electronic device that may include the ferroelectric thin-film structure according to some example embodiments.

As shown, the electronic device 1400 includes one or more electronic device components, including a processor (e.g., processing circuitry) 1420 and a memory 1430 that are communicatively coupled together via a bus 1410.

The processing circuitry 1420, may be included in, may include, and/or may be implemented by one or more instances of processing circuitry such as hardware including logic circuits, a hardware/software combination such as a processor executing software; or a combination thereof. For example, the processing circuitry 1420 may include, but is not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, the memory 1430 may include a non-transitory computer readable storage device, for example a solid state drive (SSD), storing a program of instructions, and the processing circuitry 1420 may be configured to execute the program of instructions to implement the functionality of the electronic device 1400.

In some example embodiments, the electronic device 1400 may include a ferroelectric thin-film structure, according to any example embodiments of the inventive concepts, in one or more of the processing circuitry 1420 or the memory 1430 and may exhibit improved operational performance as a result, e.g., based on one or more portions of the electronic device 1400 (e.g., the processing circuitry 1420 and/or memory 1430) having improved electric characteristics, such as leakage current characteristics or electric capacitance characteristics. In some example embodiments, the electronic device 1400 may include one or more of the electronic devices shown in FIGS. 10-12 in one or more of the processing circuitry 1420 or the memory 1430. In such example embodiments, the electronic devices 1100-1300 may be referred to as electronic device components.

Figure 15:
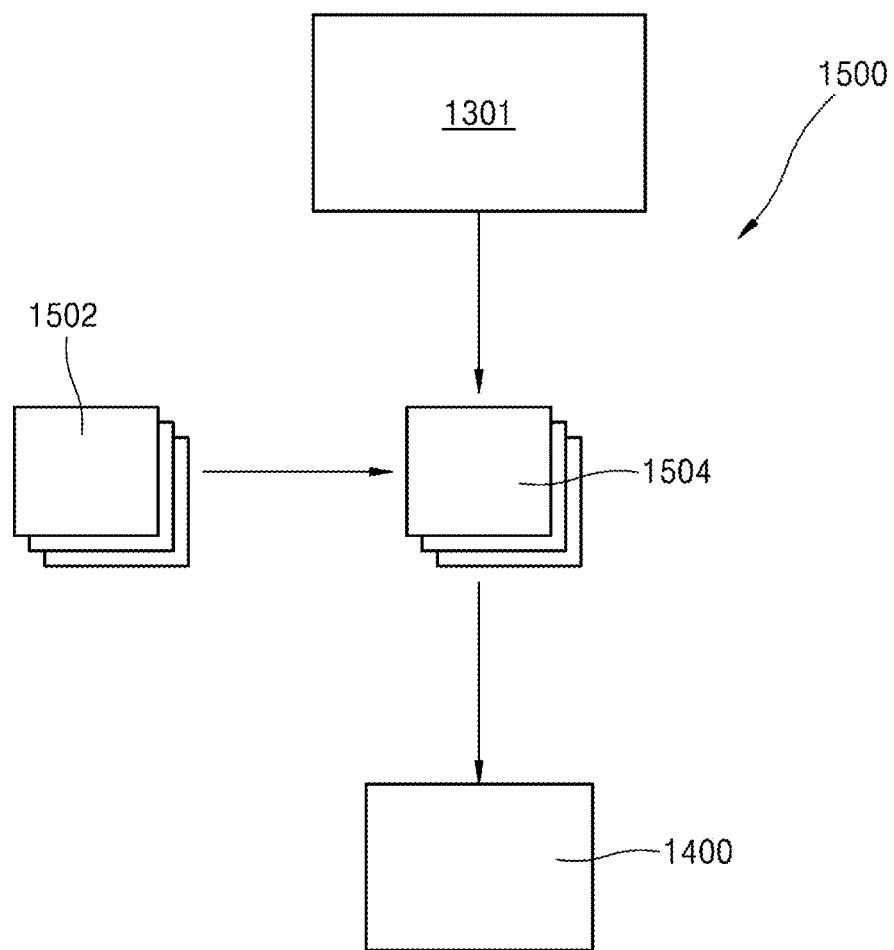
FIG. 15 shows a schematic of a system configured to control the formation of an electronic device according to some example embodiments.
Figure 16:
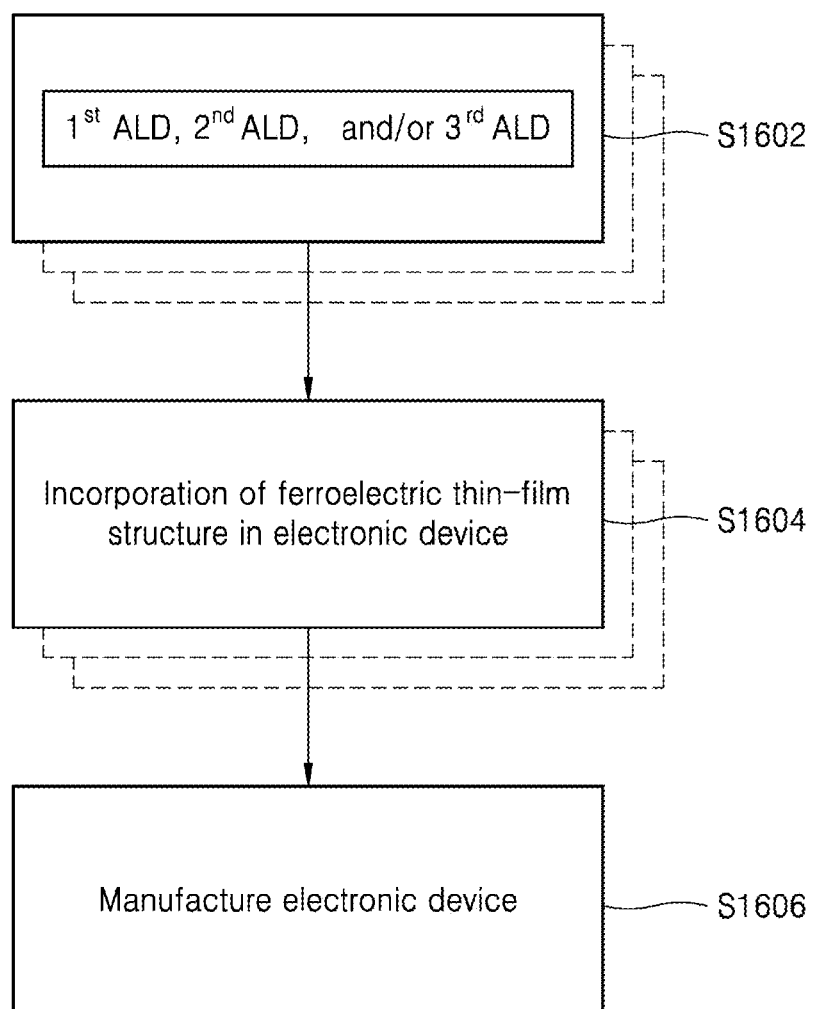
FIG. 16 is a flowchart illustrating a method implemented by the system illustrated in FIG. 15 to manufacture an electronic device according to some example embodiments.

FIG. 15 shows a schematic of a system 1500 configured to control the formation of an electronic device according to some example embodiments, and FIG. 16 is a flowchart illustrating a method implemented by the system 1500 to manufacture an electronic device according to some example embodiments. As shown, the system 1500 may include system 1301, which is configured to form a ferroelectric thin-film structure according to any of the example embodiments of the inventive concepts (S1602). The system 1500 further includes a fabrication assembly 1504 that is configured to incorporate the ferroelectric thin-film structure(s) formed by system 1301 with various electronic device sub-components 1502 (where the sub-components 1502 may be formed according to any well-known processes for forming electronic device sub-components, including printed circuit boards, power supplies, buses, communication interface components, processing circuitry components, memory components, any combination thereof, or the like). The fabrication assembly 1504 may incorporate the ferroelectric thin-film structure(s) with the sub-components 1502 (S1604), according to any well-known processes for fabricating ("manufacturing") electric device components (e.g., processing circuitries 1420, memories 1430, any of electronic devices 1100-1300, any combination thereof, or the like) and/or electronic devices themselves, to fabricate ("manufacture") electronic device(s) 1400 that include one or more ferroelectric thin-film structures according to any example embodiments of the inventive concepts (S1606). Such incorporation (S1604) and fabrication (S1606) may include, for example, assembling an electronic device component (e.g., any of electronic devices 1100-1300 as described herein, further assembling processing circuitry 1420 and/or memory 1430 based on incorporating said electronic devices to additional electronic device sub-components, etc.) based on coupling the ferroelectric thin-film structure to one or more electronic device sub-components (e.g., any well-known processing circuitry sub-components) and coupling the electronic device component to other electronic device components (e.g., printed circuit board, or PCB) via any well-known methods to form the electronic device (e.g., 1400).

According to the above-described example embodiments, a ferroelectric layer manufactured by an ALD process (e.g., manufactured according to any of the example embodiments of methods described herein) may have improved ferroelectric characteristics while retaining a small thickness thereof, due to the inclusion of an atomic layer including an oxide-based dielectric material and a dopant having a greater bandgap than that of the dielectric material, and may have improved electric characteristics, such as leakage current characteristics or electric capacitance characteristics. Although embodiments have been described above, these are merely examples, and various other modifications can be made thereon by one of ordinary skill in the art.

It should be understood that example embodiments described herein should be considered in a descriptive sense only and not for purposes of limitation. Descriptions of features or aspects within each example embodiment should typically be considered as available for other similar features or aspects in one or more example embodiments. While one or more embodiments have been described with reference to the figures, it will be understood by those of ordinary skill in the art that various changes in form and details may be made therein without departing from the spirit and scope as defined by the following claims.

What is claimed is:

1. A ferroelectric thin-film structure, comprising:
   at least one first atomic layer including a first dielectric material that is based on an oxide;
   at least one second atomic layer including a second dielectric material that is based on another oxide, the second dielectric material being different from the first dielectric material; and
   at least one third atomic layer having a different total material composition than both the at least one first atomic layer and the at least one second atomic layer, wherein the at least one second atomic layer is between the at least one first atomic layer and the at least one third atomic layer, the at least one third atomic layer including both the first dielectric material and a dopant, the dopant having a bandgap greater than a bandgap of the first dielectric material,
   wherein the ferroelectric thin-film structure has a thickness of 0.1 nm to 2 nm, and
   wherein the at least one first atomic layer, the at least one second atomic layer, and the at least one third atomic layer have a crystallized material structure such that the ferroelectric thin-film structure has ferroelectric characteristics.

2. The ferroelectric thin-film structure of claim 1, wherein the first dielectric material includes
   an oxide of at least one of hafnium (Hf), zirconium (Zr), or aluminum (Al), or
   a perovskite of at least one of hafnium (Hf), zirconium (Zr), or aluminum (Al).

3. The ferroelectric thin-film structure of claim 1, wherein the dopant includes an oxide of at least one of silicon (Si), hafnium (Hf), zirconium (Zr), aluminum (Al), lanthanum (La), yttrium (Y), strontium (Sr), or gadolinium (Gd).

4. The ferroelectric thin-film structure of claim 1, wherein the at least one third atomic layer is disposed on at least one of
an uppermost portion of the ferroelectric thin-film structure,
a middle portion of the ferroelectric thin-film structure, or
a lowermost portion of the ferroelectric thin-film structure.

5. A method of forming a ferroelectric thin-film structure by atomic layer deposition (ALD), the method comprising:
depositing, on a substrate, a first atomic layer according to a first atomic layer deposition (ALD) operation, the first atomic layer including a first dielectric material that is based on an oxide;
depositing a second atomic layer on the first atomic layer according to a second atomic layer (ALD) operation, the second atomic layer including a second dielectric material that is based on another oxide, the second dielectric material being different from the first dielectric material;
depositing a third atomic layer on the second atomic layer according to a third atomic layer (ALD) operation, the third atomic layer having a different total material composition than both the first atomic layer and the second atomic layer, the third atomic layer including both the first dielectric material and a dopant, the dopant having a bandgap greater than a bandgap of the first dielectric material; and
the crystallizing the first atomic layer, the second atomic layer, and the third atomic layer by a heat treatment such that a stacked structure including the first atomic layer, the second atomic layer and the third atomic layer has ferroelectric characteristics,
wherein the ferroelectric thin-film structure has a thickness of 0.1 nm to 2 nm.

6. The method of claim 5, wherein the depositing of the first atomic layer according to the first atomic layer deposition (ALD) operation comprises:
forming a precursor of the first dielectric material on the substrate; and
supplying an oxidant to the precursor of the first dielectric material to cause the oxidant to react with the precursor of the first dielectric material to form the first atomic layer.

7. The method of claim 5, wherein the depositing of the third atomic layer comprises:
forming a separate precursor of the first dielectric material on a portion of the second atomic layer, such that a separate portion of the second atomic layer is exposed by the separate precursor of the first dielectric material;
forming a precursor of the dopant on the separate portion of the second atomic layer which is exposed by the precursor of the first dielectric material; and
reacting the precursor of the first dielectric material and the precursor of the dopant with an oxidant to form the third atomic layer.

8. The method of claim 5, wherein the first dielectric material includes an oxide of at least one of hafnium (Hf), zirconium (Zr), or aluminum (Al), or a perovskite of at least one of hafnium (Hf), zirconium (Zr), or aluminum (Al).

9. The method of claim 5, wherein the dopant includes an oxide of at least one of silicon (Si), hafnium (Hf), zirconium (Zr), aluminum (Al), lanthanum (La), yttrium (Y), strontium (Sr), or gadolinium (Gd).

10. An electronic device, comprising:
a substrate;
a gate electrode on the substrate; and
a ferroelectric thin-film structure between the substrate and the gate electrode, the ferroelectric thin-film structure including
at least one first atomic layer including a first dielectric material that is based on an oxide;
at least one second atomic layer including a second dielectric material that is based on another oxide, the second dielectric material being different from the first dielectric material; and
at least one third atomic layer having a different total material composition than both the at least one first atomic layer and the at least one second atomic layer, wherein the at least one second atomic layer is between the at least one first atomic layer and the at least one third atomic layer, the at least one third atomic layer including both the first dielectric material and a dopant, the dopant having a bandgap greater than a bandgap of the first dielectric material,
wherein the ferroelectric thin-film s ructure has a thickness of 0.1 nm to 2 nm, and
wherein the at least one first atomic layer, the at least one second atomic layer, and the at least one third atomic layer have a crystallized material structure such that the ferroelectric thin-film structure has ferroelectric characteristics.

11. The electronic device of claim 10, wherein the first dielectric material includes
an oxide of at least one of hafnium (Hf), zirconium (Zr), or aluminum (Al), or
a perovskite of at least one of hafnium (Hf), zirconium (Zr), or aluminum (Al).

12. The electronic device of claim 10, wherein the dopant includes an oxide of at least one of silicon (Si), hafnium (Hf), zirconium (Zr), aluminum (Al), lanthanum (La), yttrium (Y), strontium (Sr), or gadolinium (Gd).

13. The electronic device of claim 10, wherein the substrate includes
a channel element vertically overlapping with the gate electrode, and
a source and a drain at opposite sides of the channel element.

14. The electronic device of claim 13, wherein the channel element includes at least one of Si, Ge, SiGe, III-V semiconductors, oxide semiconductors, nitride semiconductors, oxynitride semiconductors, 2-dimensional (2D) materials, quantum dots, or organic semiconductors.

15. An electronic device, comprising:
a first electrode and a second electrode spaced apart from each other; and
a ferroelectric thin-film structure between the first electrode and the second electrode, wherein the ferroelectric thin-film structure includes
at least one first atomic layer including a first dielectric material that is based on an oxide;
at least one second atomic layer including a second dielectric material that is based on another oxide, the second dielectric material being different from the first dielectric material; and
at least one third atomic layer having a different total material composition than both the at least one first atomic layer and the at least one second atomic layer, wherein the at least one second atomic layer is between the at least one first atomic layer and the at least one third atomic layer, the at least one third atomic layer including both the first dielectric material and a dopant, the dopant having a bandgap that is greater than a bandgap of the first dielectric material, wherein the ferroelectric thin-film structure has a thickness 0.1 nm to 2 nm, and wherein the atleast one first atomic layer, the atleast one second atomic layer, and the at least one third atomic layer have a crystallized material structure such that the ferroelectric thin-film structure has ferroelectric characteristics.

16. A method of manufacturing an electronic device, the method comprising:
   forming a ferroelectric thin-film structure according to the method of claim 5; and
   fabricating the electronic device based on incorporating the ferroelectric thin-film structure into an electronic device component.

17. The method of claim 16, wherein the electronic device component includes at least one of a processing circuitry or a memory.

18. A system for forming a ferroelectric thin-film structure, the system comprising:
   a process chamber including a pedestal or chuck configured to structurally support a substrate in the process chamber;
   a plurality of composition sources and a plurality of control devices, each composition source coupled to the process chamber via a separate control device, each control device configured to control a supply of a separate material held in a separate coupled composition source to the process chamber; and
   an electronic device configured to control at least the plurality of control devices to deposit, on the substrate in the process chamber, a first atomic layer according to a first atomic layer deposition (ALD) operation, the first atomic layer including a first dielectric material that is based on an oxide,
   deposit a second atomic layer on the first atomic layer according to a second atomic layer deposition (ALD) operation, the second atomic layer including a second dielectric material that is based on another oxide, the second dielectric material being different from the first dielectric material, and
   deposit a third atomic layer on the second atomic layer according to a third atomic layer deposition (ALD) operation, the third atomic layer having a different total material composition than both the first atomic layer and the second atomic layer, the third atomic layer including both the first dielectric material and a dopant, the dopant having a bandgap greater than a bandgap of the first dielectric material, wherein the ferroelectric thin-film structure has a thickness of 0.1 nm to 2 nm, and wherein the first atomic layer, the second atomic layer, and the third atomic layer have a crystallized material stricture such that the ferroelectric thin-film structure has ferroelectric characteristics.

19. The system of claim 18, further comprising:
   a heat source configured to heat at least a portion of the process chamber,
   wherein the electronic device is configured to control the heat source to perform a heat treatment process on the first, second, and third atomic layers to crystallize the first, second, and third atomic layers.

\* \* \* \* \*